US008835019B2

(12) United States Patent
Choi et al.

(10) Patent No.: US 8,835,019 B2
(45) Date of Patent: Sep. 16, 2014

(54) ORGANIC LIGHT EMITTING DEVICE HAVING AN ELECTRON TRANSPORT-EMISSION LAYER AND METHOD OF PREPARING THE SAME

(75) Inventors: Kyung-Hoon Choi, Suwon-si (KR); Kwan-Hee Lee, Suwon-si (KR); Min-Seung Chun, Suwon-si (KR); Choon-Woo Lim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 786 days.

(21) Appl. No.: 12/121,825

(22) Filed: May 16, 2008

(65) Prior Publication Data
US 2008/0299365 A1 Dec. 4, 2008

(30) Foreign Application Priority Data
May 31, 2007 (KR) ........................ 10-2007-0053414

(51) Int. Cl.
H01L 51/54 (2006.01)
C09K 11/06 (2006.01)
H01L 27/32 (2006.01)
H01L 51/52 (2006.01)
H05B 33/14 (2006.01)

(52) U.S. Cl.
CPC ......... C09K 11/06 (2013.01); C09K 2211/1033 (2013.01); H01L 27/3211 (2013.01); C09K 2211/1037 (2013.01); H01L 51/5265 (2013.01); H05B 33/14 (2013.01); C09K 2211/1011 (2013.01); C09K 2211/1029 (2013.01); H01L 2251/558 (2013.01); C09K 2211/188 (2013.01); Y10S 428/917 (2013.01)
USPC ........... 428/690; 428/917; 313/504; 313/506; 257/40

(58) Field of Classification Search
None
See application file for complete search history.

(56) References Cited

U.S. PATENT DOCUMENTS

| 4,356,429 | A | 10/1982 | Tang |
| 5,220,348 | A | 6/1993 | D'Aurelio |
| 5,256,506 | A | 10/1993 | Ellis et al. |
| 5,278,023 | A | 1/1994 | Bills et al. |
| 5,308,737 | A | 5/1994 | Bills et al. |
| 5,909,081 | A | 6/1999 | Eida et al. |
| 5,937,272 | A | 8/1999 | Tang |
| 5,998,085 | A | 12/1999 | Isberg et al. |
| 6,013,982 | A | 1/2000 | Thompson et al. |
| 6,097,147 | A | 8/2000 | Baldo et al. |
| 6,252,253 | B1 | 6/2001 | Bao et al. |
| 6,281,634 | B1 | 8/2001 | Yokoyama |
| 6,303,238 | B1 | 10/2001 | Thompson et al. |
| 6,310,360 | B1 | 10/2001 | Forrest et al. |
| 6,384,529 | B2 | 5/2002 | Tang et al. |
| 6,429,585 | B1 | 8/2002 | Kitazume et al. |
| 6,520,819 | B1 | 2/2003 | Sakaguchi |
| 6,541,130 | B2 | 4/2003 | Fukuda |
| 6,614,175 | B2 | 9/2003 | Aziz et al. |
| 6,627,333 | B2 * | 9/2003 | Hatwar .................. 428/690 |
| 6,835,469 | B2 | 12/2004 | Kwong et al. |
| 6,863,961 | B2 | 3/2005 | Miyashita et al. |
| 6,876,144 | B2 | 4/2005 | Peng |
| 6,891,326 | B2 | 5/2005 | Lu |
| 6,917,159 | B2 | 7/2005 | Tyan et al. |
| 7,012,377 | B2 | 3/2006 | Yuki |
| 7,034,339 | B2 | 4/2006 | Matsuura et al. |
| 7,067,985 | B2 | 6/2006 | Adachi |
| 7,129,632 | B2 | 10/2006 | Park et al. |
| 7,154,219 | B2 * | 12/2006 | Hamada et al. ............... 313/506 |
| 7,189,466 | B2 | 3/2007 | Moriyama et al. |
| 7,358,660 | B2 | 4/2008 | Yamada et al. |
| 7,705,529 | B2 * | 4/2010 | Kim et al. .................. 313/504 |
| 7,776,457 | B2 * | 8/2010 | Lee et al. .................. 428/690 |
| 2002/0050786 | A1 | 5/2002 | Yamazaki et al. |
| 2002/0125818 | A1 | 9/2002 | Sato et al. |
| 2003/0076032 | A1 | 4/2003 | Suzuri et al. |
| 2004/0023062 | A1 * | 2/2004 | Kathirgamanathan et al. .................. 428/690 |
| 2004/0124766 | A1 * | 7/2004 | Nakagawa et al. .......... 313/504 |
| 2004/0140757 | A1 * | 7/2004 | Tyan et al. ................. 313/504 |
| 2004/0169461 | A1 | 9/2004 | Moriyama et al. |
| 2004/0258954 | A1 | 12/2004 | Takasu et al. |
| 2005/0057150 | A1 * | 3/2005 | Kim et al. .................. 313/504 |
| 2005/0112402 | A1 | 5/2005 | Lee et al. |
| 2005/0112403 | A1 | 5/2005 | Ju et al. |
| 2005/0164033 | A1 * | 7/2005 | Chin et al. ................. 428/690 |
| 2005/0184653 | A1 | 8/2005 | Suh et al. |
| 2005/0233166 | A1 | 10/2005 | Ricks et al. |
| 2006/0105201 | A1 * | 5/2006 | Lee et al. .................. 428/690 |
| 2006/0177694 | A1 | 8/2006 | Kamatani et al. |
| 2006/0199038 | A1 * | 9/2006 | Lee .......................... 428/690 |
| 2007/0075637 | A1 * | 4/2007 | Kim et al. .................. 313/506 |
| 2008/0111474 | A1 * | 5/2008 | Sung et al. ................. 313/504 |
| 2008/0157657 | A1 * | 7/2008 | Matsunami et al. ......... 313/504 |
| 2008/0164809 | A1 * | 7/2008 | Matsunami et al. ......... 313/504 |

FOREIGN PATENT DOCUMENTS

| CN | 1212114 A | 3/1999 |
| CN | 1242134 A | 1/2000 |

(Continued)

OTHER PUBLICATIONS

Lee et al. "Stable styrylamine-doped blue organic electroluminescent device based on 2-methyl-9, 10-di(2-naphthyl)anthracene" Applied Physics Letters 2004, 85, 3301-3303. Date of publication: Oct. 11, 2004.*

(Continued)

Primary Examiner — Andrew K Bohaty
(74) Attorney, Agent, or Firm — Christie, Parker & Hale, LLP

(57) ABSTRACT

Organic light emitting devices including an electron transport-emission layer, and methods of preparing the same are included. The electron transport-emission layer may be an electron transport-red emission layer, an electron transport-green emission layer or an electron transport-blue emission layer. The methods produce high yields of the organic light emitting devices and are less expensive than conventional methods.

17 Claims, 9 Drawing Sheets

(56) References Cited

FOREIGN PATENT DOCUMENTS

| | | |
|---|---|---|
| JP | 09-115669 | 5/1997 |
| JP | 10-055888 | 2/1998 |
| JP | 11-003782 | 1/1999 |
| JP | 11-204258 | 7/1999 |
| JP | 2000-036386 | 2/2000 |
| JP | 2000-208254 | 7/2000 |
| JP | 2001-250694 | 9/2001 |
| JP | 2002-075645 | 3/2002 |
| JP | 2002-184581 | 6/2002 |
| JP | 2002-260858 | 9/2002 |
| JP | 2003-007467 | 1/2003 |
| JP | 2003-151776 | 5/2003 |
| JP | 2005-174639 | 6/2005 |
| KR | 10-2000-0062303 | 10/2000 |
| KR | 10-2003-0019897 | 3/2003 |
| KR | 10-2003-0020034 | 3/2003 |
| KR | 10-2005-0040960 | 5/2005 |
| KR | 10-2005-0050487 | 5/2005 |
| KR | 10-2005-0050489 | 5/2005 |
| WO | WO 02/44189 A1 | 6/2002 |
| WO | WO 03/017730 A1 | 2/2003 |
| WO | WO 03/094578 A1 | 11/2003 |
| WO | WO 2004/047196 A2 | 6/2004 |
| WO | WO 2007021117 A1 * | 2/2007 |

OTHER PUBLICATIONS

Korean Patent Abstracts, Publication No. 1020050040960 A; Date of Publication: May 4, 2005; in the name of Dong Hyun Jung, et al.*

Qureshi et al. "Electroluminescent properties of dimeric bis(2-(2'-hydroxylphenyl)benzthiazolate)zinc (II) complex" Solid State Communications 2005, 133, 305-309. Date of online publication: Dec. 2, 2004.*

KIPO Office action dated Sep. 27, 2005, for Korean Patent application 10-2003-0063752, 2 pages.

KIPO Office action dated Jan. 26, 2006, for Korean Patent application 10-2003-0084749, 2 pages.

English translation of Korean Patent application 10-2003-0084238, dated Nov. 25, 2003, corresponding to Korean Publication 10-2005-0050487, listed above, 25 pages.

Ikai, M, et al., *Highly efficient phosphorescence from organic light-emitting devices with an excition-block layer,* Applied Physics Letters, vol. 79, No. 2, Jul. 9, 2001, pp. 156-158.

SIPO Office action dated Aug. 31, 2007, for Chinese Patent application 200410085026.7, with English translation, 7 pages.

SIPO Office action dated Oct. 19, 2007, for Chinese Patent application 2004100786519, with English translation, 18 pages.

SIPO Office action dated Feb. 6, 2009, for Chinese Patent application 200510117757.X, with English translation, 14 pages.

Japanese Office action dated Sep. 2, 2008, for Japanese Patent application 2005-169945, 3 pages.

U.S. Office action dated Feb 23, 2009, for cross-reference U.S Appl. No. 11/268,477 (now U.S. Patent 7,776,457), 20 pages.

U.S. Office action dated Mar. 31, 2008, for cross-reference U.S. Appl. No. 10/938,471 (now U.S. Patent 7,705,529), 14 pages.

U.S. Office action dated Sep. 4, 2008, for cross-reference U.S. Appl. No. 10/903,697, 14 pages.

U.S. Office action dated May 11, 2007, for cross-reference U.S. Appl. No. 10/980,090, 11 pages.

U.S. Office action dated May 27, 2009, for cross-reference U.S. Appl. No. 10/938,471 (now U.S. Patent 7,705,529), 10 pages.

U.S. Office action dated Aug. 14, 2009, for cross-reference U.S. Appl. No. 10/903,697, 7 pages.

U.S. Office action dated Feb. 23, 2010, for cross-reference U.S. Appl. No. 12/559,449, 13 pages.

U.S. Office action dated Jul. 30, 2010, for cross-reference U.S. Appl. No. 12/559,449, 9 pages.

* cited by examiner

ORGANIC LIGHT EMITTING DEVICE HAVING AN ELECTRON TRANSPORT-EMISSION LAYER AND METHOD OF PREPARING THE SAME

CROSS-REFERENCE TO RELATED PATENT APPLICATIONS

This application claims priority to and the benefit of Korean Patent Application No. 10-2007-0053414, filed on May 31, 2007 in the Korean Intellectual Property Office, the entire content of which is incorporated herein by reference.

BACKGROUND OF THE INVENTION

1. Field of the Invention

The present invention relates to organic light emitting devices and methods of preparing the same. More particularly, the present invention relates to an organic light emitting device including an electron transporting-red emission layer for emitting red light, an electron transporting-green emission layer for emitting green light, or an electron transporting-blue emission layer for emitting blue light.

2. Description of the Related Art

Organic light emitting devices ("OLEDs") are self emissive devices, have wide viewing angles, excellent contrast characteristics, and quick response times. Due to these advantages, OLEDs have drawn much attention. In addition, OLEDs have excellent driving voltage characteristics and excellent response speed characteristics, and can produce various colors. Thus, a lot of research is being carried out into OLEDs.

An OLED generally includes an anode/emission layer/cathode stacked structure. The OLED may also include a hole injection layer, a hole transport layer, and/or an electron injection layer stacked between the anode and the emission layer or between the emission layer and the cathode. Therefore, OLEDs can have an anode/hole transport layer/emission layer/cathode structure, or an anode/hole transport layer/emission layer/electron injection layer/cathode structure. However, conventional OLEDs are manufactured by complex process and materials are lost during deposition, making conventional OLEDs unsuitable for mass production.

SUMMARY OF THE INVENTION

In one embodiment of the present invention, an OLED includes an electron transporting-red emission layer for emitting red light, an electron transporting-green emission layer for emitting green light, or an electron transporting-blue emission layer for emitting blue light.

In another embodiment of the present invention, a method of preparing the OLED is provided.

According to one embodiment of the present invention, an OLED includes a substrate, a first electrode, a second electrode, and an organic layer between the first electrode and the second electrode. The organic layer includes: a) a green emission layer patterned in a green subpixel, a blue emission layer patterned in a blue subpixel, and an electron transporting-red emission layer which covers the red, green, and blue subpixels; b) a red emission layer patterned in a red subpixel, a blue emission layer patterned in a blue subpixel, and an electron transporting-green emission layer which covers the red, green, and blue subpixels; or c) a red emission layer patterned in a red subpixel, a green emission layer patterned in a green subpixel, and an electron transporting-blue emission layer which covers the red, green, and blue subpixels.

The organic light emitting device further includes at least one layer selected from hole injection layers, hole transport layers, hole blocking layers, and electron injection layers.

When the organic layer further includes a hole injection layer, the thickness of the hole injection layer of the red subpixel is greater than or equal to the thickness of the hole injection layer of the green subpixel, which is greater than or equal to the thickness of the hole injection layer of the blue subpixel.

According to another embodiment of the present invention, a method of preparing an organic light emitting device includes forming a first electrode on a substrate, forming an organic layer on the first electrode, and forming a second electrode on the organic layer. In one embodiment, the step of forming an organic layer includes forming a green emission layer in a green subpixel, forming a blue emission layer in a blue subpixel, and then forming an electron transporting-red emission layer over the red, green, and blue subpixels. The green emission layer is formed using a green emission layer deposition mask and the blue emission layer is formed using a blue emission layer deposition mask. The electron transporting-red emission layer is formed using an open mask.

In an alternative embodiment, a red emission layer is formed in a red subpixel, a blue emission layer is formed in a blue subpixel, and then an electron transporting-green emission layer is formed over the red, green, and blue subpixels. The red emission layer is formed using a red emission layer deposition mask and the blue emission layer is formed using a blue emission layer deposition mask. The electron transporting-green emission layer is formed using an open mask.

In another embodiment, a red emission layer is formed in a red subpixel, a green emission layer is formed in a green subpixel, and then an electron transporting-blue emission layer is formed over the red, green, and blue subpixels. The red emission layer is formed using a red emission layer deposition mask and the green emission layer is formed using a green emission layer deposition mask. The electron transporting-blue emission layer is formed using an open mask.

The step of forming an organic layer may further include at least one process selected from forming a hole injection layer, forming a hole transport layer, forming a hole blocking layer, and forming an electron injection layer.

The methods of the present invention can produce high yields of OLEDs at low costs.

BRIEF DESCRIPTION OF THE DRAWINGS

The above and other features and advantages of the present invention will become more apparent by reference to the following detailed description when considered in conjunction with the attached drawings in which.

DETAILED DESCRIPTION OF THE INVENTION

Figure 1:
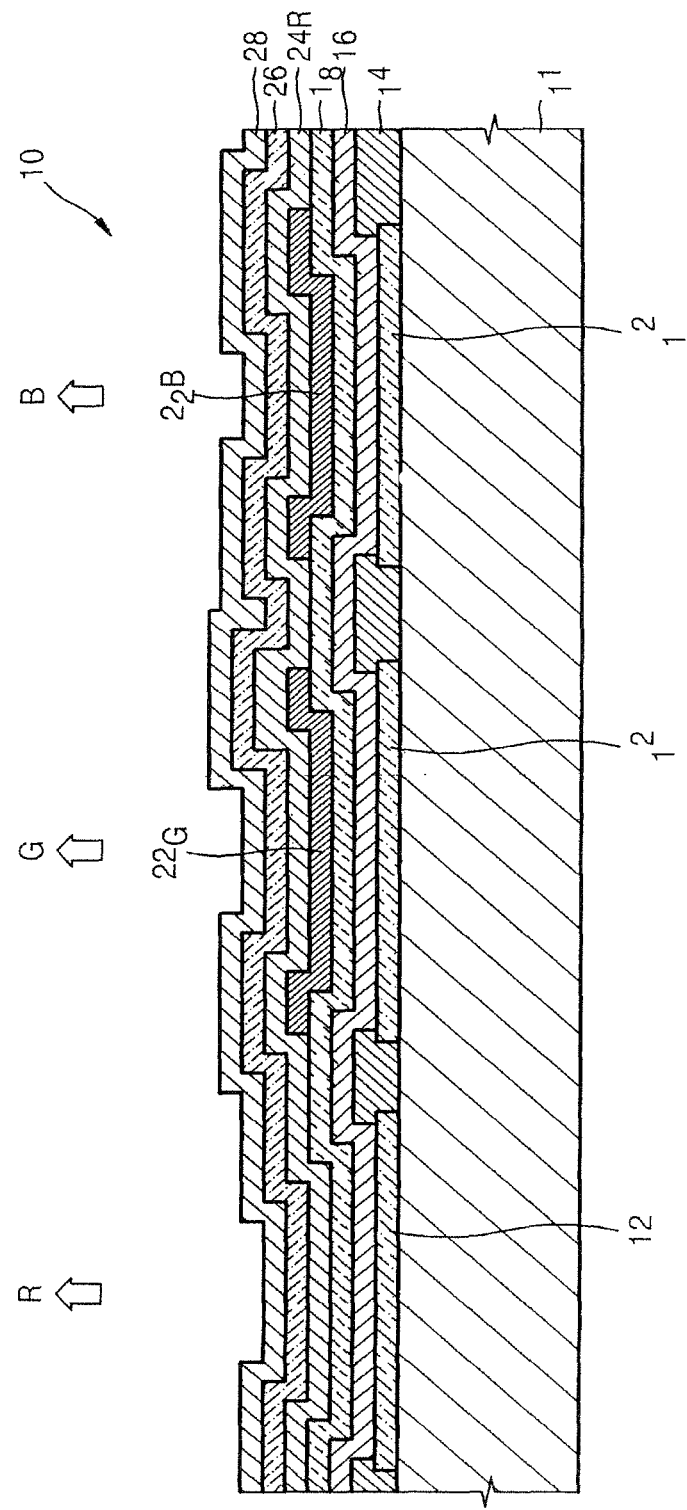
FIG. 1 is a schematic cross-sectional view of an organic light emitting device according to one embodiment of the present invention.

FIG. 1 is a schematic cross-sectional view of an OLED 10 according to one embodiment of the present invention. Referring to FIG. 1, the OLED 10 includes a substrate 11, first electrodes 12, a hole injection layer 16, and a hole transport layer 18. A green emission layer 22G is patterned on the portion of the hole transport layer 18 corresponding to a green subpixel (G), and a blue emission layer 22B is patterned on the portion of the hole transport layer 18 corresponding to a blue subpixel (B). An electron transporting-red emission layer 24R, an electron injection layer 26, and a second electrode 28 are then formed on the resulting structure.

The substrate 11 illustrated in FIG. 1 can be any substrate used in OLEDs. Nonlimiting examples of suitable substrates include glass substrates and transparent plastic substrates, each of which have good mechanical strength, thermal stability, transparency, and surface planarization, and each of which are waterproof and easily treatable. Although not illustrated in FIG. 1, a planarization layer, an insulating layer, or the like can also be formed on the substrate 11.

The first electrodes 12 are formed on the substrate 11. The first electrodes 12 can be patterned to correspond to red, green or blue subpixels, as illustrated in FIG. 1, but are not limited thereto. The first electrodes 12 can be anodes or cathodes. The first electrodes 12 can be transparent electrodes, semi-transparent electrodes, or reflective electrodes. Nonlimiting examples of suitable materials for the first electrodes 12 include ITO, IZO, $SnO_2$, ZnO, Al, Ag, Mg, or the like. In addition, the first electrodes 12 can have a layered structure including two or more layers formed of at least two kinds of materials.

The spaces between the first electrodes 12 may be filled with an insulating layer 14. The insulating layer 14 can be formed of any known insulating material. Nonlimiting examples of suitable materials for the insulating layer include inorganic materials, such as $SiO_2$, $SiN_x$, and the like, and organic materials, such as polyimide-based resins, acryl-based resins, and the like.

The hole injection layer 16 is formed on the first electrodes 12. The hole injection layer 16 can cover the red, green, and blue subpixels, as illustrated in FIG. 1. The hole injection layer 16 may have various structures. For example, unlike the embodiment illustrated in FIG. 1, the hole injection layer 16 can be patterned such that each of the red, green and blue subpixels is covered by an individual hole injection layer.

The hole injection layer 16 can be formed using various methods, such as vacuum deposition, spin coating, casting, Langmuir-Blodgett (LB), and the like.

When the hole injection layer 16 is formed by vacuum deposition, the deposition conditions may differ according to the compound used to form the hole injection layer, the structure and thermal characteristics of the hole injection layer to be formed, and the like. However, in general, the deposition conditions may include a deposition temperature ranging from about 100 to about 500° C., a vacuum pressure ranging from about $10^{-8}$ to about $10^{-3}$ torr, and a deposition speed ranging from about 0.01 to about 100 Å/sec.

When the hole injection layer 16 is formed by spin coating, the spin coating conditions may differ according to the compound used to form the hole injection layer, the structure and thermal characteristics of the hole injection layer to be formed, and the like. However, in general, the spin coating conditions may include a coating speed ranging from about 2000 rpm to about 5000 rpm, and a heat treatment temperature (at which the used solvent is removed after the spin coating) ranging from about 80° C. to about 200° C.

The hole injection layer 16 can be formed of any known hole injecting material. Nonlimiting examples of suitable materials for the hole injection layer 16 include phthalocyanine compounds (such as copper phthalocyanine), starburst-type amine derivatives (such as TCTA, m-MTDATA, or m-MTDAPB), and conductive polymers (such as polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and (polyaniline)/poly(4-styrene-sulfonate) (PANI/PSS).

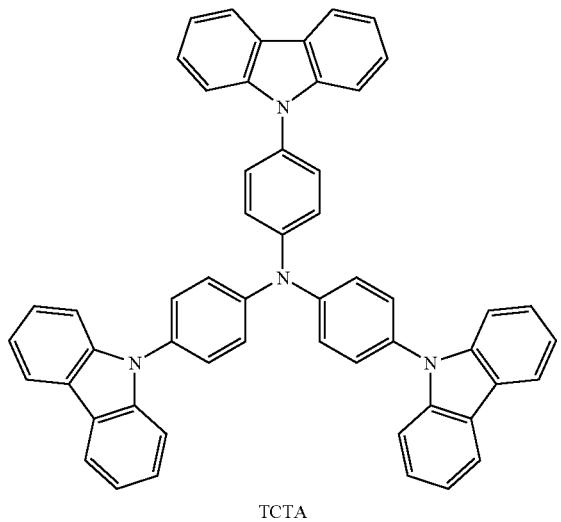

TCTA

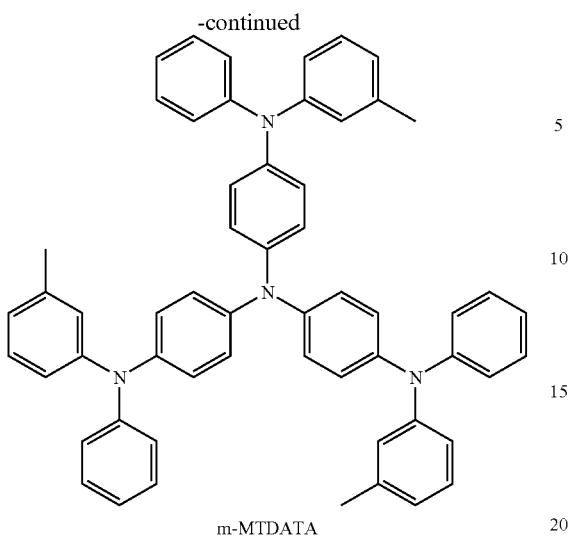

m-MTDATA

The hole injection layer 16 may have a thickness ranging from about 10 nm to about 200 nm. In one embodiment, for example, the hole injection layer 16 has a thickness ranging from about 60 nm to about 150 nm. The thickness of the hole injection layer 16 may be determined in consideration of process time and manufacturing costs.

The hole transport layer 18 is disposed on the hole injection layer 16. The hole transport layer 18 can be formed using various methods, such as vacuum deposition, spin coating, casting, LB, and the like. When the hole transport layer 18 is formed by deposition or spin coating, the deposition or coating conditions may differ according to the compound used to form the hole transport layer. However, in general, the deposition or coating conditions may be similar to the deposition or coating conditions used to form the hole injection layer 16.

Nonlimiting examples of suitable materials for the hole transport layer 18 include 1,3,5-tricarbazolylbenzene, 4,4'-biscarbazolylbiphenyl, polyvinylcarbazole, m-biscarbazolylbenzene, 4,4'-biscarbazolyl-2,2'-dimethylbiphenyl, 4,4',4''-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD), N,N'-di(naphthalene-1-yl)-N,N'-diphenyl benzidine (α-NPD), N,N'-diphenyl-N,N'-bis(1-naphthyl)-(1,1'-biphenyl)-4,4'-diamine (NPB), IDE320 (produced by Idemitz Co.), (poly(9,9-dioctylfluorene-co-N-(4-butylphenyl)diphenylamine) (TFB), (poly(9,9-dioctylfluorene-co-bis-(4-butylphenyl-bis-N,N-phenyl-1,4-phenylenediamine) (PFB), or the like.

The thickness of the hole transport layer 18 may range from about 10 nm to about 200 nm. In one embodiment, for example, the thickness ranges from about 20 nm to about 150 nm. The thickness of the hole transport layer 18 may be determined in consideration of process time and manufacturing costs.

As illustrated in FIG. 1, the hole transport layer can cover the red, green, and blue subpixels. The hole transport layer 18 may have various structures. For example, unlike that illustrated in FIG. 1, the hole transport layer 18 can be patterned such that each of the red, green and blue subpixels is covered by an individual hole transport layer.

The green emission layer 22G is patterned on the portion of the hole transport layer 18 corresponding to the green subpixel, and the blue emission layer 22B is patterned on the portion of the hole transport layer 18 corresponding to the blue subpixel.

The green emission layer 22G and the blue emission layer 22B can be formed of various known emissive materials, such as known host and dopant materials. Specifically, the dopant can be a known fluorescent dopant or a known phosphorescent dopant. Nonlimiting examples of suitable host materials include $Alq_3$, 4,4'-N,N'-dicarbazole-biphenyl (CBP), poly n-vinylcarbazole (PVK), distyrylarylene (DSA), and the like.

Nonlimiting examples of suitable green dopants include $Ir(ppy)_3$ where ppy denotes phenylpyridine, $Ir(ppy)_2(acac)$, $Ir(mpyp)_3$, C545T, and the like.

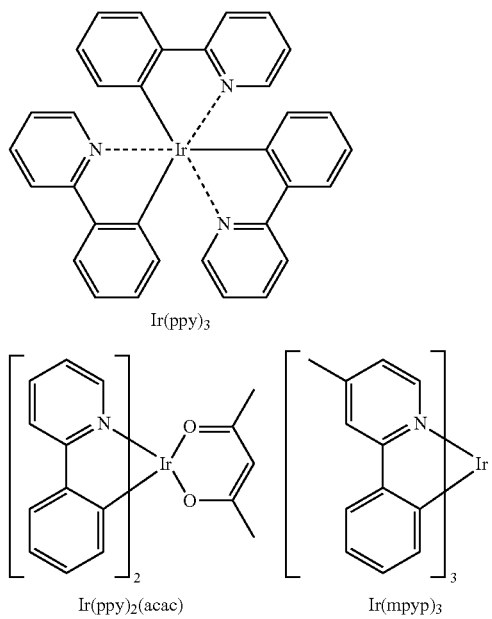

$Ir(ppy)_3$ $Ir(ppy)_2(acac)$        $Ir(mpyp)_3$

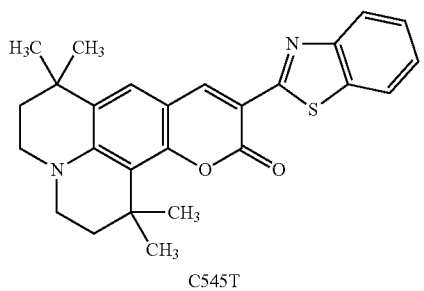

C545T

Nonlimiting examples of suitable blue dopants include $F_2Irpic$, $(F_2ppy)_2Ir(tmd)$, $Ir(dfppz)_3$, ter-fluorene, and the like.

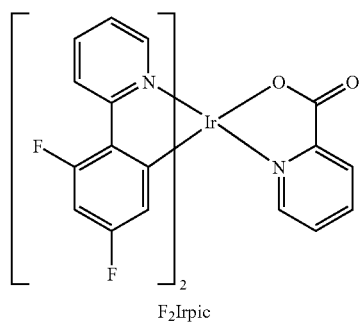

$F_2Irpic$

-continued

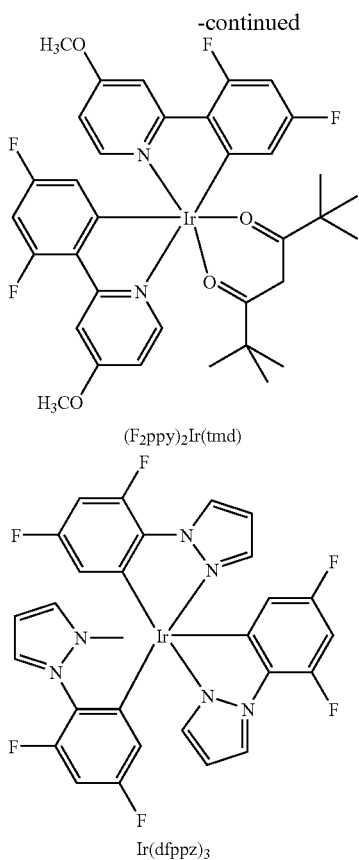

(F₂ppy)₂Ir(tmd)

Ir(dfppz)₃

In one embodiment, the green host can be a compound represented by Formula 1, below.

Formula 1

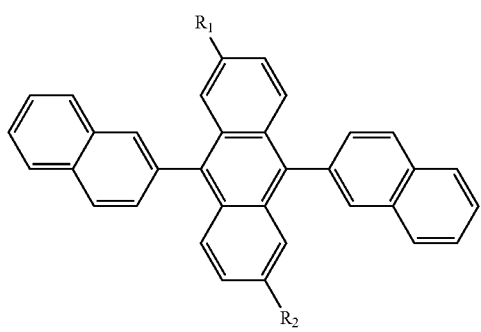

In Formula 1, $R_1$ and $R_2$ are each independently selected from hydrogen and $C_6$-$C_{30}$ aryl groups. Nonlimiting examples of suitable $C_6$-$C_{30}$ aryl groups include pentalenyl groups, indenyl groups, phenyl groups, naphthyl groups, azulenyl groups, heptalenyl groups, biphenylenyl groups, acenaphthylenyl groups, fluorenyl groups, phenalenyl groups, phenanthrenyl groups, anthracenyl groups, fluoranthenyl groups, triphenylenyl groups, pyrenyl groups, chrysenyl groups, naphthacenyl groups, picenyl groups, perylenyl groups, pentaphenyl groups, and hexacenyl groups. In one embodiment, at least hydrogen in the $C_6$-$C_{30}$ aryl group is substituted with a hydroxyl group, cyano group, a $C_1$-$C_{10}$ alkyl group (such as a methyl group, ethyl group, or the like), or a $C_1$-$C_{10}$ alkoxy group (such as a methoxy group, an ethoxy group, or the like).

Nonlimiting examples of suitable green host materials include Compounds 1 through 3 illustrated below.

Compound 1

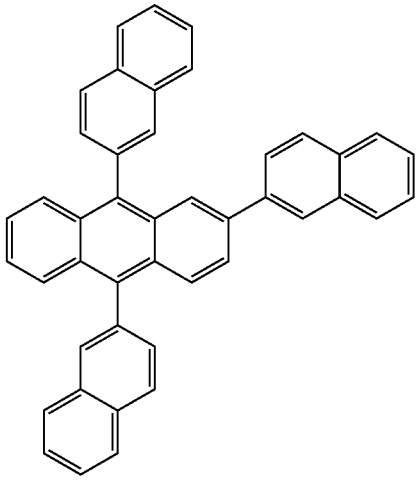

Compound 2

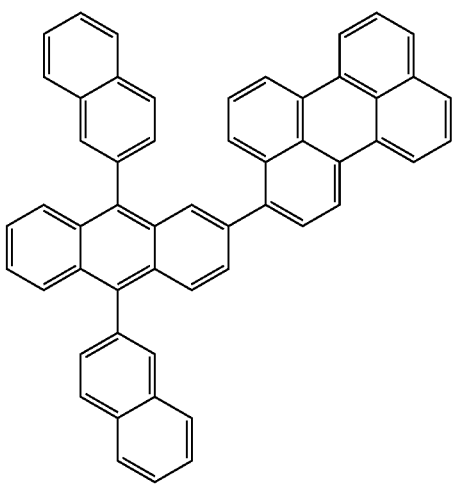

Compound 3

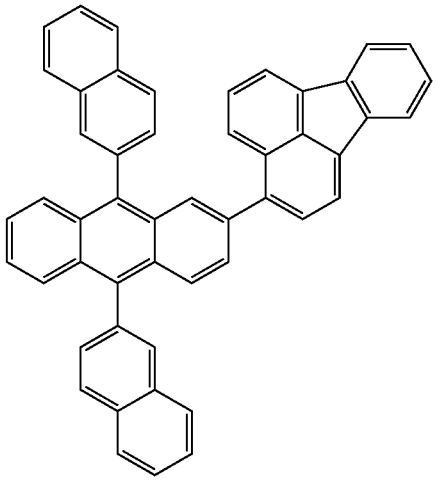

In one embodiment, the green dopant can be a compound represented by Formula 2 below.

Formula 2

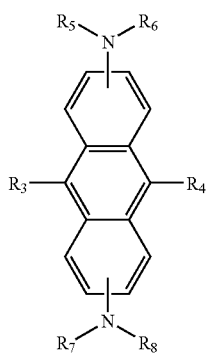

In Formula 2, $R_3$, $R_4$, $R_5$, $R_6$, $R_7$, and $R_8$ are each independently selected from hydrogen, $C_1$-$C_{20}$ alkyl groups, $C_1$-$C_{20}$ alkoxy groups, and $C_6$-$C_{30}$ aryl groups. Nonlimiting examples of suitable $C_1$-$C_{20}$ alkyl groups include methyl groups, ethyl groups, propyl groups, butyl groups, and the like. Nonlimiting examples of suitable $C_1$-$C_{20}$ alkoxy groups include methoxy groups, ethoxy groups, propoxy groups, butoxy groups, and the like. The $C_6$-$C_{30}$ aryl group may be the same as that described above with respect to the green host material.

Nonlimiting examples of suitable green dopant materials include Compounds 4, 5, and 6 illustrated below.

Compound 4

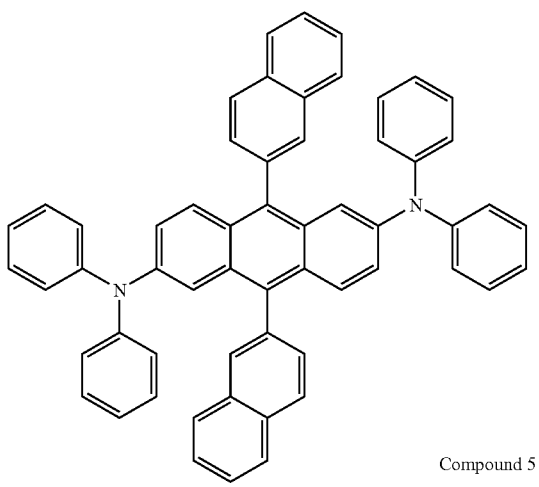

Compound 5

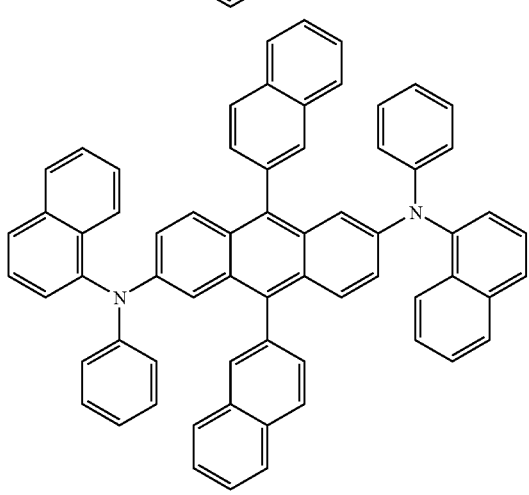

Compound 6

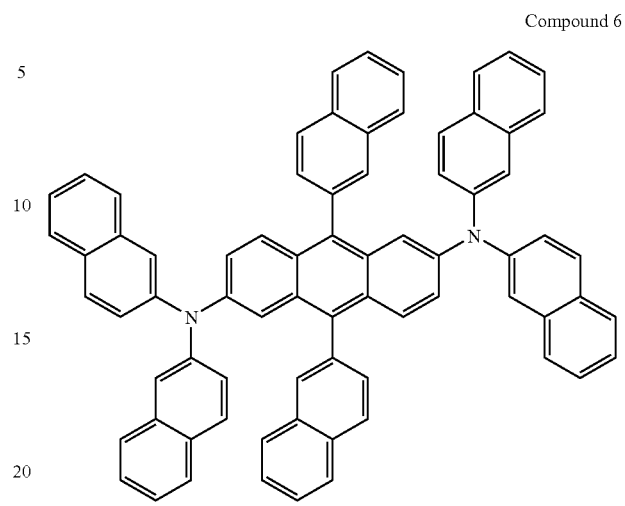

The dopant may be present in an amount ranging from about 0.1 to about 50 parts by weight based on 100 parts by weight of the total amount of host and dopant. In one embodiment, for example, the dopant may be present in an amount ranging from about 0.5 to about 35 parts by weight based on 100 parts by weight of the total amount of host and dopant. When the dopant is present within these ranges, concentration quenching may be prevented.

The thickness of each of the green emission layer 22G and the blue emission layer 22B may range from about 10 nm to about 100 nm. In one embodiment, for example, the thickness may range from about 10 nm to about 60 nm. When the thickness of the emission layers is within these ranges, excellent emission characteristics can be obtained.

When the green emission layer 22G and the blue emission layer 22B are formed by deposition, the green emission layer 22G can be formed using a green emission layer deposition mask, followed by formation of the blue emission layer 22B using a blue emission layer deposition mask.

An electron transporting-red emission layer 24R may be formed on the green emission layer 22G and the blue emission layer 22B. The electron transporting-red emission layer 24R can cover the red, green, and blue subpixels as illustrated in FIG. 1.

The electron transporting-red emission layer 24R can transport electrons and emit red light. Referring to FIG. 1, in the red subpixel, the electron transporting-red emission layer 24R is formed on the hole transport layer 18. The organic light emitting device 10 illustrated in FIG. 1 can emit red light through the electron transporting-red emission layer 24R.

The electron transporting-red emission layer 24R may include at least one material selected from organic metal complexes represented by Formula 3.

$$[M L_2]_a$$ Formula 3

In Formula 3, L is an anionic ligand, M is a metal capable of making a 5- or 6-coordinate bond with L, and a is an integer ranging from 2 to 4. Since a is an integer ranging from 2 to 4, the organic metal complex is a form of oligomer, and not a monomer.

In Formula 3, M is a metal capable of making a 5- or 6-coordinate bond with L. Accordingly, the organic metal complex represented by Formula 3 may be an oligomer having two or more metals, M. The two or more metals (M) can be bound to a single ligand at the same time. Nonlimiting examples of suitable metals for M include Zn, Co, Ni, and Fe.

In Formula 3, L is an anionic ligand and can be coordinated to one or more central metal, M. Nonlimiting examples of suitable ligands (L) include those represented by Formulae 4a, 4b, 4c, and 4d.

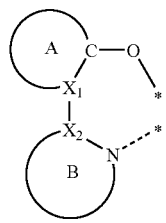

Formula 4a

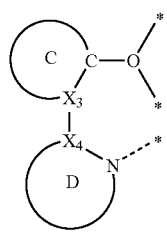

Formula 4b

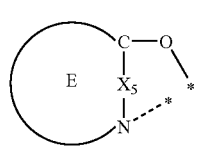

Formula 4c

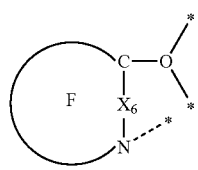

Formula 4d

The ligands represented by Formulae 4b and 4d have three sites for binding with M (represented by *) and can bond to two metals (M) (refer to Formulae 6, 7, 8, and 9). Therefore, an organic metal complex having an oligomer shape represented by Formula 3 can be obtained.

In Formulae 4a, 4b, 4c, and 4d, A, B, C, D, E, and F are each independently selected from aromatic rings and heteroaromatic rings. For example, A, B, C, and D may each independently be a 5-20 member aromatic ring or a 5-20 member heteroaromatic ring.

Nonlimiting examples of suitable rings for A and C include benzene and naphthalene. Nonlimiting examples of suitable rings for B and D include pyridine, benzothiazole, benzooxazole, quinoline, and benzoimidazole. Nonlimiting examples of suitable rings for E and F include quinoline and benzoquinoline.

A and B can be combined using various methods. For example, A and B can be bound to each other through a single bond, or can be fused to each other. C and D can also be combined using various methods. For example, C and D can be bound to each other through a single bond, or can be fused to each other.

In Formulae 4a and 4b, $X_1$, $X_2$, $X_3$ and $X_4$ are each independently selected from C, N, O, S and P. In Formulae 4c and 4d, $X_5$ and $X_6$ are each independently selected from $C_1$-$C_{10}$ alkylenes and $C_2$-$C_{10}$ alkenylenes.

In Formulae 4a, 4b, 4c, and 4d, * denotes a site for bonding with M.

Nonlimiting examples of suitable ligands for L include those represented by Formula 5, below.

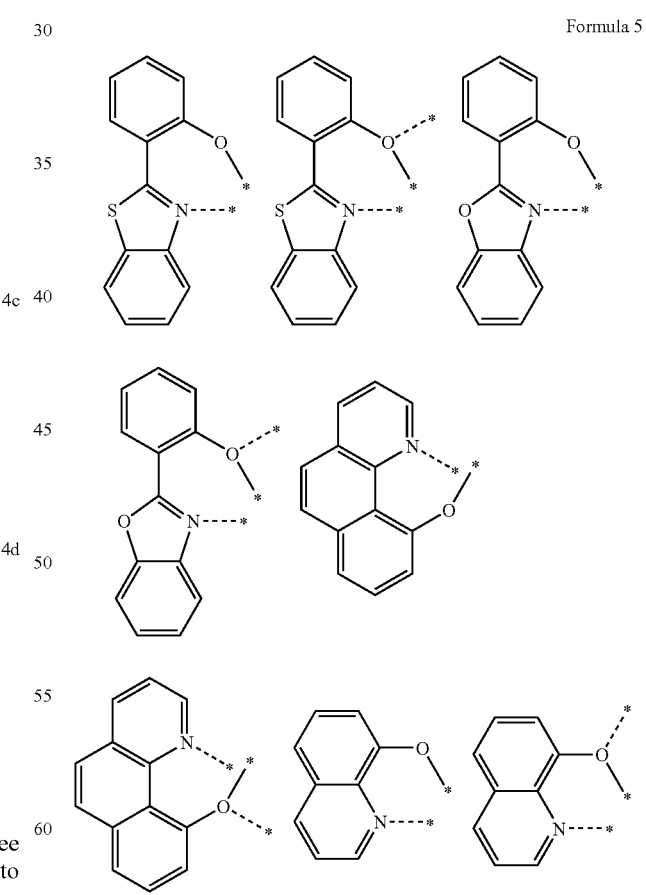

Formula 5

Nonlimiting examples of suitable compounds satisfying Formula 3 include compounds represented by Formulae 6, 7, 8 and 9, below.

Formula 6

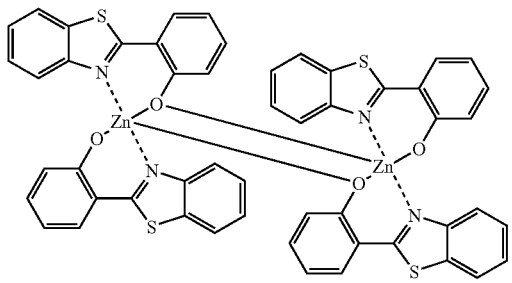

Formula 7

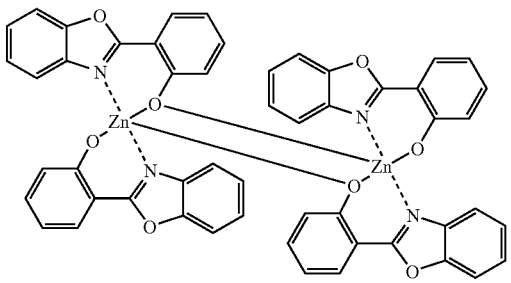

Formula 8

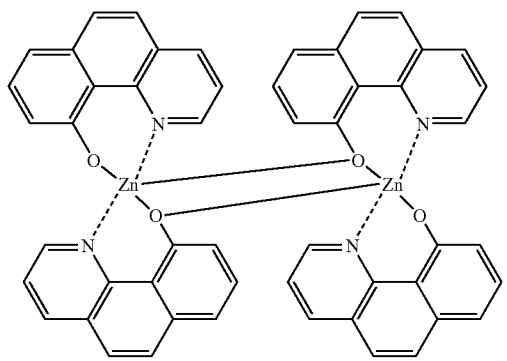

Formula 9

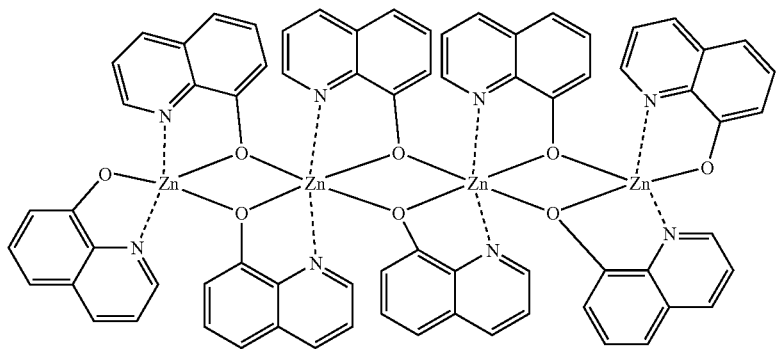

in addition to the organic metal complex represented by Formula 3, the electron transporting-red emission layer 24R may further include a phosphorescent dopant, in which case the organic metal complex represented by Formula 3 is used as a host. The phosphorescent dopant can be any phosphorescent dopant known in the art. Nonlimiting examples of suitable phosphorescent dopants include organic metal complexes containing Ir, Pt, Os, Re, Ti, Zr, or Hf. For example, the phosphorescent dopant may be an organic metal complex containing Ir or Pt. When the phosphorescent dopant is a 4-coordinate Pt-containing organic metal complex, the emission layer can be formed at relatively low temperatures, thereby obtaining high yield, excellent efficiency, and excellent lifetime characteristics.

Specific nonlimiting examples of suitable phosphorescent dopants include bisthienylpyridine acetylacetonate Iridium, bis(benzothienylpyridine)acetylacetonate Iridium, bis(2-phenylbenzothiazole)acetylacetonate Iridium, bis(1-phenylisoquinoline)acetylacetonate Iridium, tris(1-phenylisoquinoline)Iridium, tris(phenylpyridine)Iridium, tris(2-biphenylpyridine)Iridium, tris(3-biphenyl pyridine)Iridium, tris(4-biphenyl pyridine)Iridium, Ir(pq)$_2$(acac) (where pq denotes 2-phenylquinoline and acac denotes acetylacetone (refer to Formula 10)), Platinum(II)octaethylporphyrin (PtOEP), Ir(piq)$_3$ (where piq denotes phenylisoquinoline (refer to Formula 11)), Ir(piq)$_2$acac (refer to Formula 12), compounds represented by Formula 13, compounds represented by Formula 14, compounds represented by Formula 15, compounds represented by Formula 16, and mixtures thereof.

Formula 10

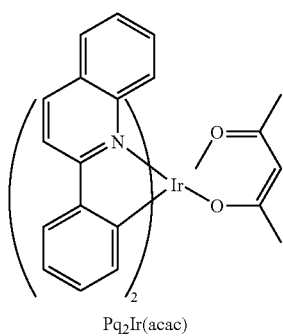

Pq$_2$Ir(acac)

-continued

Formula 11

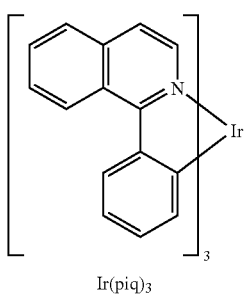

Ir(piq)₃

Formula 12

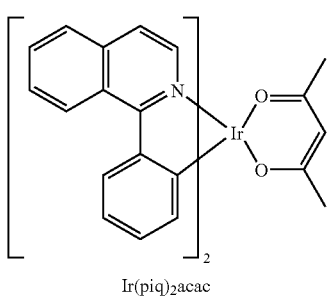

Ir(piq)₂acac

Formula 13

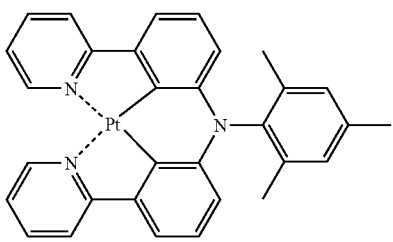

Formula 14

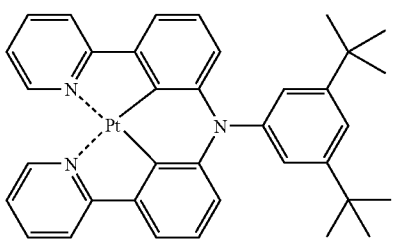

Formula 15

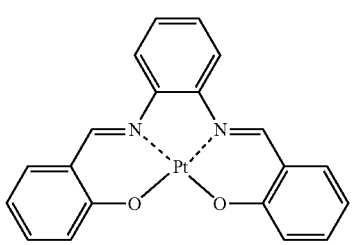

Formula 16

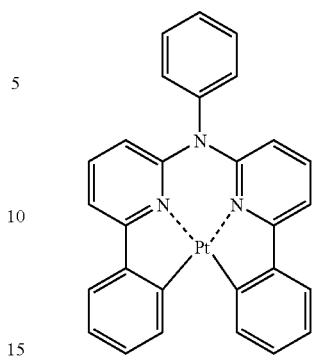

The electron transporting-red emission layer 24R can be formed using an open mask, and can cover the red, green, and blue subpixels. As used herein, the term "open mask" refers to a mask for forming a layer covering an emission unit including red, green, and blue subpixels. For example, the open mask may have a structure such that the portions corresponding to the emission unit including red, green, and blue subpixels are open. Accordingly, by using the open mask, a common layer covering the red, green, and blue subpixels can be formed.

The electron injection layer 26 is formed of a material that enables easy injection of electrons from an anode, and is formed on the electron transporting-red emission layer 24R. The electron injection layer 26 can be formed using various methods, such as vacuum deposition, spin coating, and casting. When the electron injection layer 26 is formed by vacuum deposition or spin coating, the vacuum deposition or spin coating conditions may differ according to the compound used. However, the vacuum deposition or spin coating conditions may be similar to the vacuum deposition or spin coating conditions discussed above under which the hole injection layer 16 is formed. The electron injection layer 26 can cover the red, green, and blue subpixels, as illustrated in FIG. 1.

The electron injection layer 26 can be formed of any electron injection layer material known in the art, nonlimiting examples of which include LiQ, NaQ, CsQ, LiF, NaCl, CsF, Li₂O, and BaO. The thickness of the electron injection layer 26 may range from about 0.1 nm to about 10 nm. In one embodiment, for example, the thickness ranges from about 0.5 nm to about 9 nm. When the thickness of the electron injection layer 26 is within these range, excellent electron injecting characteristics and driving voltage characteristics can be obtained.

A second electrode 28 is disposed on the electron injection layer 26. The second electrode 28 can be formed using vacuum deposition or sputtering. The second electrode 28 can be a cathode or an anode. The second electrode 28 can be formed of a metal, an alloy, an electroconductive compound, or a blend thereof, each of which has a low work function. Nonlimiting examples of suitable materials for the second electrode 28 include Li, Mg, Al, Al—Li, Ca, Mg—In, Mg—Ag, and the like. The second electrode 28 can have other structures. For example, the second electrode 28 can have a layered structure including two or more layers formed of at least two kinds of materials.

In an OLED according to the embodiment of the present invention illustrated in FIG. 1, each red subpixel includes the first electrodes 12, the hole injection layer 16, the hole transport layer 18, the electron transporting-red emission layer 24R, the electron injection layer 26, and the second electrode 28. Each green subpixel includes the first electrodes 12, the hole injection layer 16, the hole transport layer 18, the green emission layer 22G, the electron transporting-red emission layer 24R, the electron injection layer 26, and the second electrode 28. Each blue subpixel includes the first electrodes 12, the hole injection layer 16, the hole transport layer 18, the blue emission layer 22B, the electron transporting-red emission layer 24R, the electron injection layer 26, and the second electrode 28. In the red subpixel, the electron transporting-red emission layer 24R can emit red light and transport electrons.

The OLED having the structure described above is more easily prepared than a conventional OLED. According to a conventional method of preparing an OLED, a red emission layer, a green emission layer, and a blue emission layer are separately formed, and then an electron transport layer is formed over the red, green, and blue subpixels. Specifically, a red emission layer is formed using a red emission layer deposition mask, a green emission layer is formed using a green emission layer deposition mask, and a blue emission layer is formed using a blue emission layer deposition mask. Then, an electron transport layer is formed over the red, green, and blue subpixels using an open mask. Therefore, four masking processes are required.

However, according to one embodiment of the present invention, a method of preparing an OLED (such as that illustrated in FIG. 1) includes forming a green emission layer 22G using a green emission layer deposition mask, forming a blue emission layer 22B using a blue emission layer deposition mask, and then forming an electron transporting-red emission layer 24R using an open mask. Therefore, only three masking processes are performed.

Accordingly, a method of preparing an OLED according to one embodiment the present invention is simpler and uses fewer materials than the conventional method. Thus, costs of preparing an OLED can be reduced.

Figure 2:
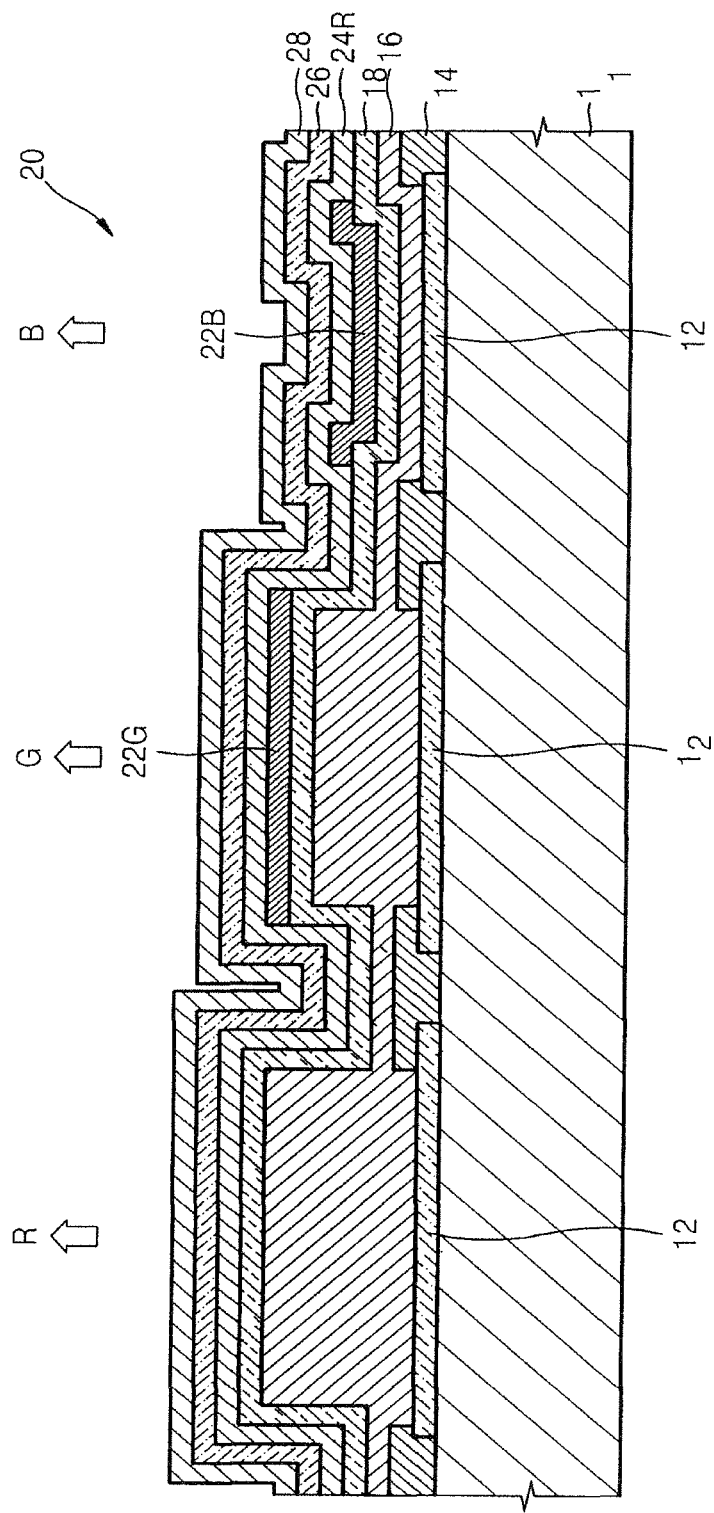
FIG. 2 is a schematic cross-sectional view of an organic light emitting device according to another embodiment of the present invention.

FIG. 2 is a cross-sectional view of an organic light emitting device 20 according to another embodiment of the present invention. The OLED 20 illustrated in FIG. 2 has the same layer structure as the OLED illustrated in FIG. 1, except for the thickness of the hole injection layer 16. In the embodiment depicted in FIG. 2, the portions of the hole injection layer 16 covering the red, green and blue subpixels may have different thicknesses. Specifically, the thickness of the portion of the hole injection layer covering the red subpixel is greater than the thickness of the portion covering the green subpixel, which is greater than the thickness of the portion covering the blue subpixel. Such variation in the thickness of the hole injection layer 16 maximizes light extraction efficiency in consideration of the resonance cycles of red light formed in the red subpixel, green light formed in the green subpixel, and blue light formed in the blue subpixel when the OLED 20 operates.

In another embodiment, although not illustrated in FIG. 2, the thickness of the hole transport layer 18 can also differ in the red, green, and blue subpixels. Specifically, the thickness of the portion of the hole transport layer covering the red subpixel may be greater than the thickness of the portion covering the green subpixel, which may be greater than the thickness of the portion covering the blue subpixel. Such variation in the thickness of the hole transport layer 18 maximizes light extraction efficiency in consideration of the resonance cycles of red light formed in the red subpixel, green light formed in the green subpixel, and blue light formed in the blue subpixel.

Figure 3:
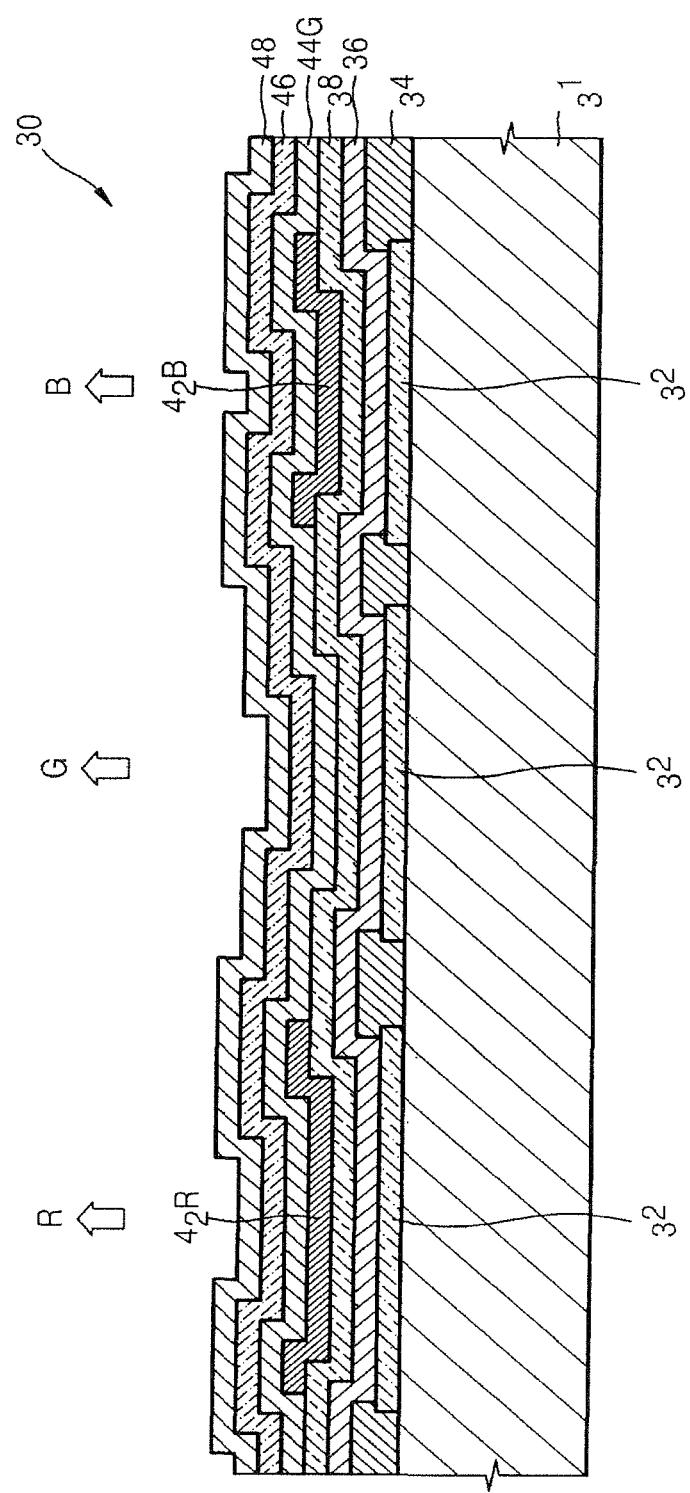
FIG. 3 is a schematic cross-sectional view of an organic light emitting device according to yet another embodiment of the present invention.

FIG. 3 is a cross-sectional view of an OLED 30 according to another embodiment of the present invention. Referring to FIG. 3, the OLED 30 includes a substrate 31, first electrodes 32, a hole injection layer 36, and a hole transport layer 38. A red emission layer 42R is patterned on the portion of the hole transport layer corresponding to the red subpixel (R), and a blue emission layer 42B is patterned on the portion of the hole transport layer 38 corresponding to the blue subpixel (B). An electron transporting-green emission layer 44G, an electron injection layer 46, and a second electrode 48 are disposed on the resulting structure.

The substrate 31, the first electrodes 32, the hole injection layer 36, the hole transport layer 38, the blue emission layer 42B, the electron injection layer 46, and the second electrode 48 are the same as in the previous embodiment described with reference to FIG. 1.

In FIG. 3, the red emission layer 42R can be formed of various emissive materials known in the art. For example, a known fluorescent host and known fluorescent dopant may be used. Alternatively, a known phosphorescent host and known phosphorescent dopant can be used.

Nonlimiting examples of suitable red hosts include $Alq_3$, 4,4'-N,N'-dicarbazole-biphenyl (CBP), poly n-vinylcarbazole (PVK), and distyrylarylene (DSA).

Nonlimiting examples of suitable red dopants include PtOEP, $Ir(piq)_3$, $Btp_2Ir(acac)$, and DCJTB.

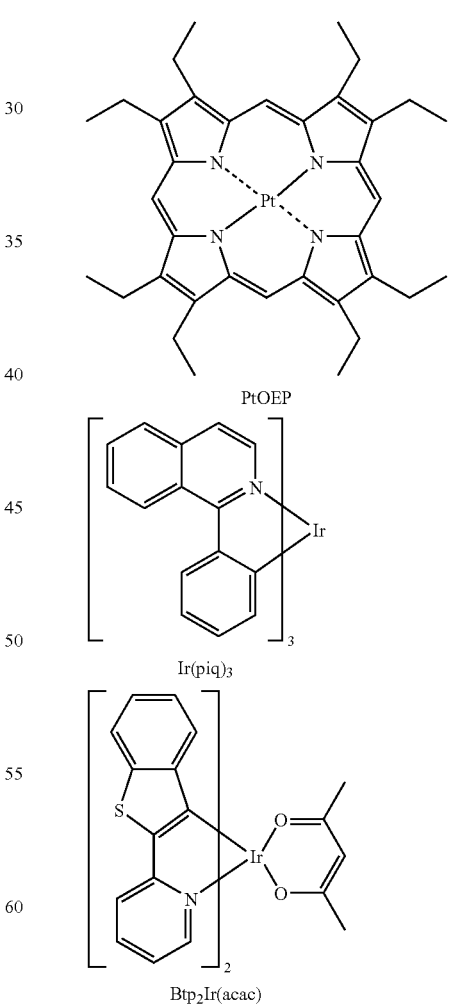

PtOEP $Ir(piq)_3$ $Btp_2Ir(acac)$

In one embodiment, the red emission layer (42R) may include an organic metal complex represented by Formula 3, as described above. In addition to the organic metal complex represented by Formula 3, in some embodiments, the red emission layer (42R) may further include a phosphorescent dopant including Ir, Pt, Os, Re, Ti, Zr or Hr, as described above.

The dopant may be present in an amount ranging from about 0.1 to about 50 parts by weight based on 100 parts by weight of the total amount of host and dopant. IN one embodiment, for example, the dopant may be present in an amount ranging from about 0.5 to about 35 parts by weight based on 100 parts by weight of the total amount of host and dopant. When the dopant is present in an amount within these ranges, concentration quenching may be prevented.

The thickness of the red emission layer 42R may range from about 10 nm to about 100 nm. In one embodiment, for example, the thickness ranges from about 10 nm to about 60 nm. When the thickness of the red emission layer 42R is within these range, excellent emission characteristics can be obtained. When the red emission layer 42R and the blue emission layer 42B illustrated in FIG. 3 are formed by deposition, the red emission layer 42R can be formed using a red emission layer deposition mask, and the blue emission layer 42B can be formed using a blue emission layer deposition mask.

An electron transporting-green emission layer 44G is formed on the red emission layer 42R and blue emission layer 42B. The electron transporting-green emission layer 44G can cover the red, green, and blue subpixels, as illustrated in FIG. 3. The electron transporting-green emission layer 44G can transport electrons and emit green light. Referring to FIG. 3, in the green subpixel, the electron transporting-green emission layer 44G is formed on the hole transport layer 38. The OLED 30 illustrated in FIG. 3 can emit green light through the electron transporting-green emission layer 44G.

The electron transporting-green emission layer 44G can include, for example, a green host represented by Formula 1 above and a green dopant represented by Formula 2 above. Specifically, the electron transporting-green emission layer 44G can include a green host selected from Compounds 1, 2, and 3 (listed above) and a green dopant selected from Compounds 4, 5, and 6 (listed above).

The electron transporting-green emission layer 44G can be formed using an open mask, and can cover the red, green, and blue subpixels.

In the OLED illustrated in FIG. 3, each red subpixel includes the first electrodes 32, the hole injection layer 36, the hole transport layer 38, the red emission layer 42R, the electron transporting-green emission layer 44G, the electron injection layer 46, and the second electrode 48. Each green subpixel includes the first electrodes 32, the hole injection layer 36, the hole transport layer 38, the electron transporting-green emission layer 44G, the electron injection layer 46, and the second electrode 48. Each blue subpixel includes the first electrodes 32, the hole injection layer 36, the hole transport layer 38, the blue emission layer 42B, the electron transporting-green emission layer 44G, the electron injection layer 46, and the second electrode 48. In the green subpixel, the electron transporting-green emission layer 44G can emit green light and transport electrons.

According to one embodiment of the present invention, a method of preparing the OLED illustrated in FIG. 3 includes forming a red emission layer 42R using a red emission layer deposition mask, forming a blue emission layer 42B using a blue emission layer deposition mask, and then forming an electron transporting-green emission layer 44G using an open mask. Accordingly, only three masking processes are performed.

The method of preparing an OLED according to the current embodiment is simpler and uses fewer materials than the conventional method of preparing an OLED. Thus, costs for preparing the OLED can be reduced.

Figure 4:
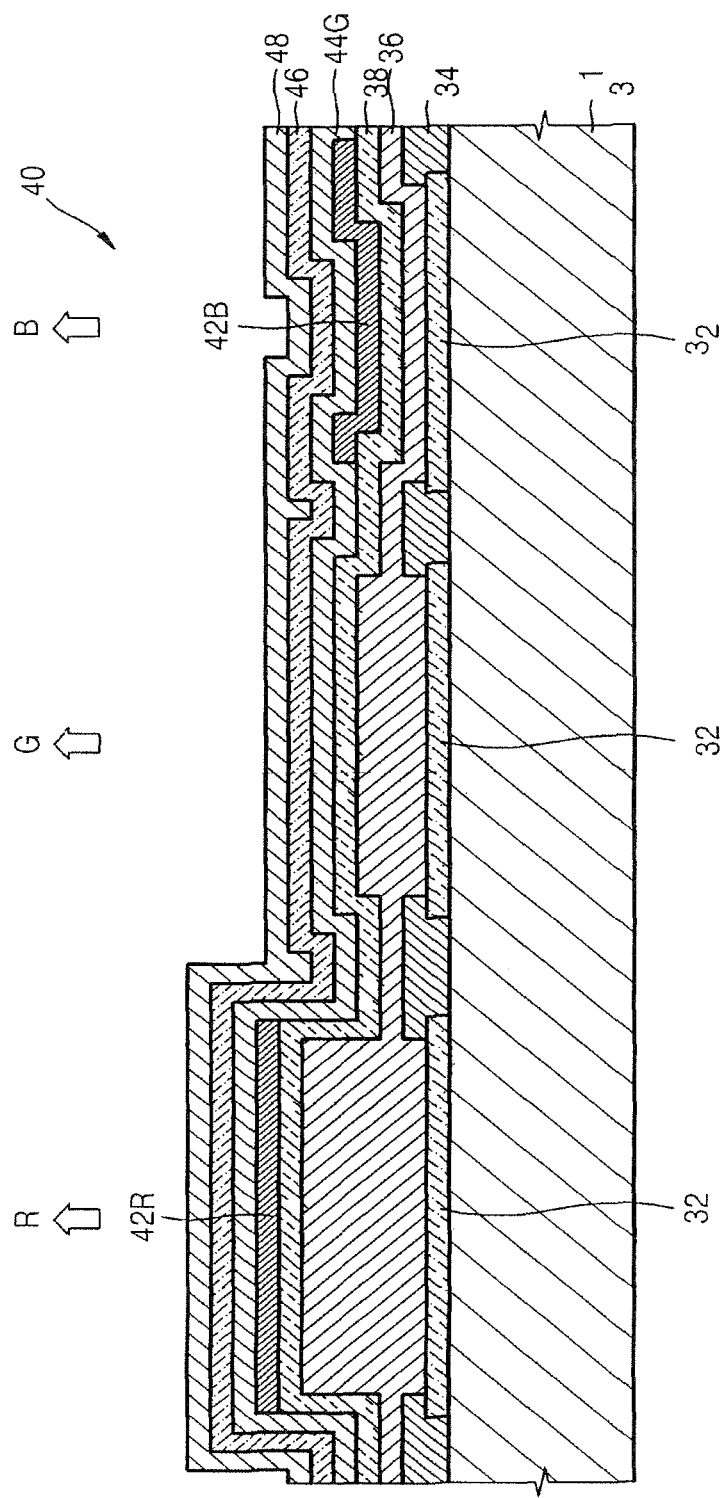
FIG. 4 is a schematic cross-sectional view of an organic light emitting device according to still another embodiment of the present invention.

FIG. 4 is a cross-sectional view of an OLED 40 according to another embodiment of the present invention. The OLED 40 illustrated in FIG. 4 has the same layered structure as the OLED illustrated in FIG. 3, except for the thickness of the hole injection layer 36. In the embodiment depicted in FIG. 4, the portions of the hole injection layer 36 covering the red, green and blue subpixels may have different thicknesses. Specifically, the thickness of the portion of the hole injection layer covering the red subpixel is greater than the thickness of the portion covering the green subpixel, which is greater than the thickness of the portion covering the blue subpixel. Such variations in the thickness of the hole injection layer 36 maximizes light extraction efficiency in consideration of the resonance cycles of red light formed in the red subpixel, green light formed in the green subpixel, and blue light formed in the blue subpixel when the OLED 40 operates.

In another embodiment, although not illustrated in FIG. 4, the thickness of the hole transport layer 38 can also differ in the red, green, and blue subpixels. Specifically, the thickness of the portion of the hole transport layer covering the red subpixel is greater than the thickness of the portion covering the green subpixel, which is greater than thickness of the portion covering the blue subpixel. Such variations in the thickness of the hole transport layer 38 maximize light extraction efficiency in consideration of the resonance cycles of red light formed in the red subpixel, green light formed in the green subpixel, and blue light formed in the blue subpixel when the OLED 40 operates.

Figure 5:
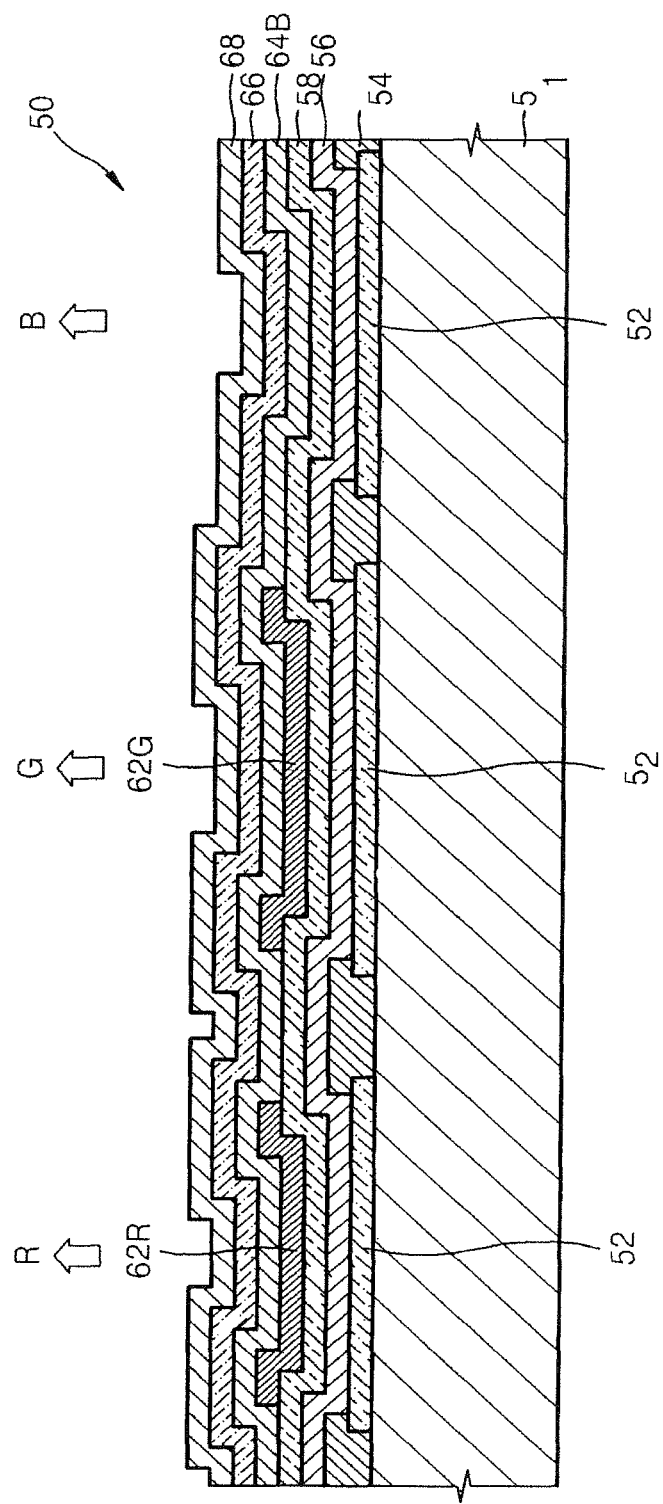
FIG. 5 is a schematic cross-sectional view of an organic light emitting device according to still yet another embodiment of the present invention.

FIG. 5 is a cross-sectional view of an OLED 50 according to another embodiment of the present invention. Referring to FIG. 5, the OLED 50 includes a substrate 51, first electrodes 52, a hole injection layer 56, and a hole transport layer 58. A red emission layer 62R is patterned on the portion of the hole transport layer corresponding to the red subpixel (R), and a green emission layer 62G is patterned on the portion of the hole transport layer 58 corresponding to the green subpixel (G). An electron transporting-blue emission layer 64B for emitting blue light, an electron injection layer 66, and a second electrode 68 are formed on the resulting structure.

The substrate 51, the first electrodes 52, the hole injection layer 56, the hole transport layer 58, the red emission layer 62R, the green emission layer 62G, the electron injection layer 66, and the second electrode 68 are the same as described above with respect to the OLED depicted in FIGS. 1 and 3.

When the red emission layer 62R and the green emission layer 62G illustrated in FIG. 5 are formed by deposition, the red emission layer 62R can be formed using a red emission layer deposition mask, and the green emission layer 62G can be formed using a green emission layer deposition mask.

The electron transporting-blue emission layer 64B for emitting blue light is formed on the red emission layer 62R and the green emission layer 62G. The electron transporting-blue emission layer 64B can cover the red, green, and blue subpixels, as illustrated in FIG. 5.

The electron transporting-blue emission layer 64B can transport electrons and emit blue light. Referring to FIG. 5, in the blue subpixel (B), the electron transporting-blue emission layer 64B is formed on the hole transport layer 58. The OLED 50 illustrated in FIG. 5 can emit blue light through the electron transporting-blue emission layer 64B.

The electron transporting-blue emission layer 64B can include a blue host selected from Compounds 7, 8, 9 and 10, below.

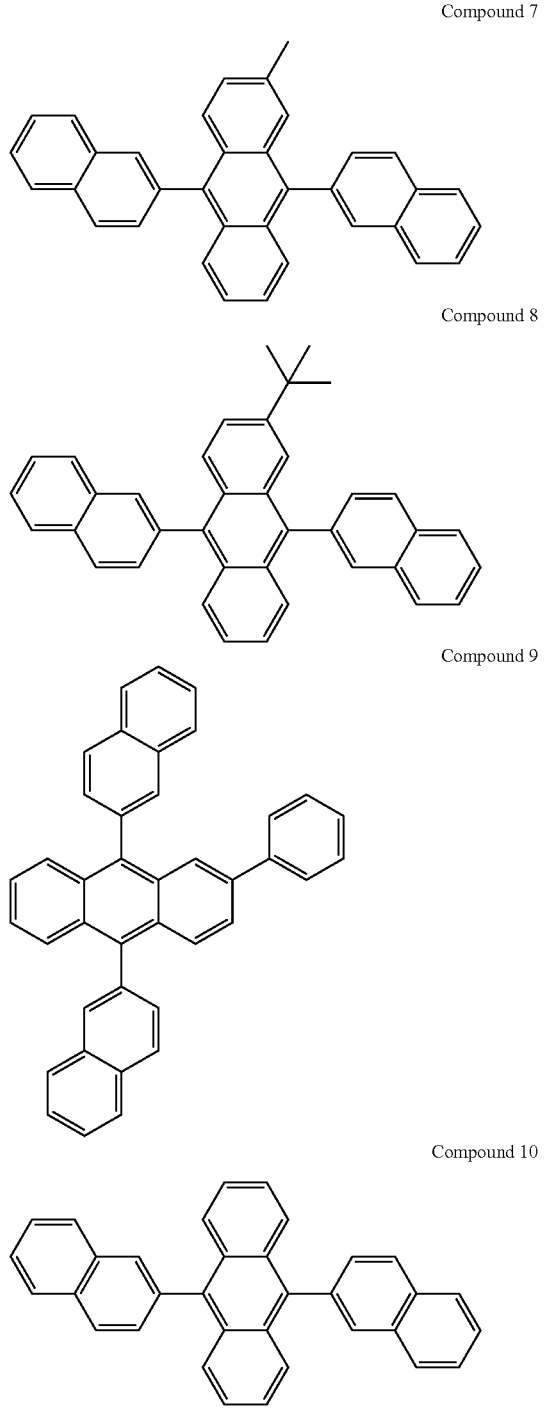

Compound 7

Compound 8

Compound 9

Compound 10

The electron transporting-blue emission layer 64B can further include a blue dopant, such as GBD32, GBD132, or GBD69, each available from Gracel Co.

The electron transporting-blue emission layer 64B can be formed using an open mask and cover the red, green, and blue subpixels.

In the OLED illustrated in FIG. 5, each red subpixel includes first electrodes 52, the hole injection layer 56, the hole transport layer 58, the red emission layer 62R, the electron transporting-blue emission layer 64B, the electron injection layer 66, and the second electrode 68. Each green subpixel includes first electrodes 52, the hole injection layer 56, the hole transport layer 58, the green emission layer 62G, the electron transporting-blue emission layer 64B, the electron injection layer 66, and the second electrode 68. Each blue subpixel includes first electrodes 52, the hole injection layer 56, the hole transport layer 58, the electron transporting-blue emission layer 64B, the electron injection layer 66, and the second electrode 68. That is, in the blue subpixel, the electron transporting-blue emission layer 64B can emit blue light and transport electrons.

According to one embodiment of the present invention, a method of preparing the OLED illustrated in FIG. 5 includes forming a red emission layer 62R using a red emission layer deposition mask, forming a green emission layer 62G using a green emission layer deposition mask, and then forming an electron transporting-blue emission layer 64B using an open mask. Accordingly, only three masking processes are performed.

The method of preparing an OLED according to the current embodiment is simpler and uses fewer materials than the conventional method of preparing an OLED. Thus, costs for preparing the OLED can be reduced.

Figure 6:
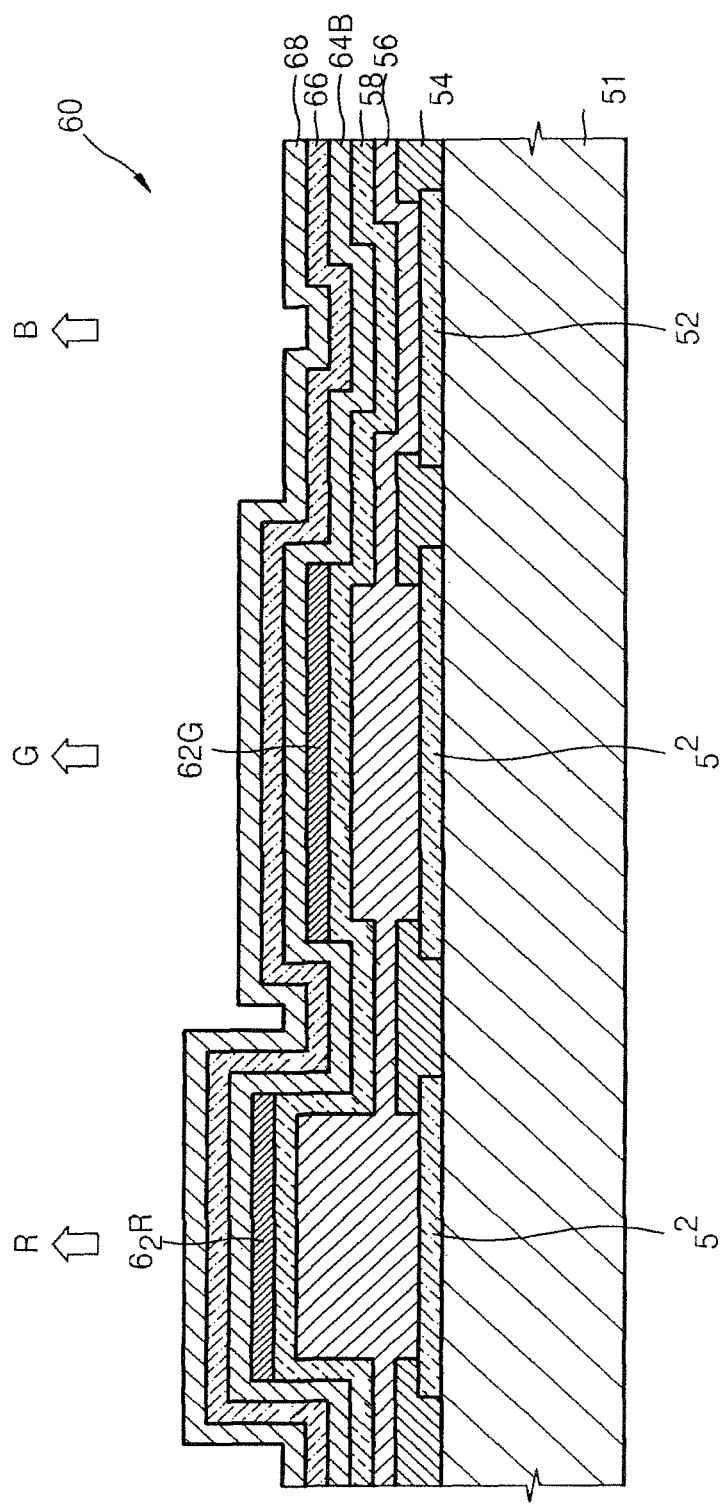
FIG. 6 is a schematic cross-sectional view of an organic light emitting device according to yet another embodiment of the present invention.

FIG. 6 is a cross-sectional view of an OLED 60 according to another embodiment of the present invention. The OLED 60 illustrated in FIG. 6 has the same layered structure as the OLED illustrated in FIG. 5, except for the thickness of the hole injection layer 56. In the embodiment depicted in FIG. 6, the portions of the hole injection layer 56 covering the red, green and blue subpixels may have different thicknesses. Specifically, the thickness of the portion of the hole injection layer covering the red subpixel (R) is greater than the thickness of the portion covering the green subpixel (G), which is greater than the thickness of the portion covering the blue subpixel (B). Such variations in the thickness of the hole injection layer 56 maximize light extraction efficiency in consideration of the resonance cycles of red light formed in the red subpixel (R), green light formed in the green subpixel (G), and blue light formed in the blue subpixel (B) when the OLED 40 operates.

In another embodiment, although not illustrated in FIG. 6, the thickness of the hole transport layer 58 can also differ in the red, green, and blue subpixels. Specifically, the thickness of the portion of the hole transport layer covering the red subpixel is greater than the thickness of the portion covering the green subpixel, which is greater than the thickness of the portion covering the blue subpixel. Such variations in the thickness of the hole injection layer 58 maximize light extraction efficiency in consideration of the resonance cycles of red light formed in the red subpixel (R), green light formed in the green subpixel (G), and blue light formed in the blue subpixel (B), when the OLED 40 operates.

Exemplary OLEDs according to the present invention have been described with reference to FIGS. 1 through 6. However, it is understood that the OLEDs can have other structures. For example, an OLED according to an embodiment of the present invention can include a hole blocking layer (HBL) formed on an emission layer. The HBL prevents diffusion of triplet excitons or holes to the electron transport layer when the emission layer includes a phosphorescent dopant.

The present invention will now be described with reference to the following examples. These examples are presented for illustrative purposes only and are not intended to limit the scope of the present invention.

EXAMPLES

Example 1

A 100 nm-thick Ag and ITO substrate (produced by SDI Co., Ltd) was cut to a size of 50 mm×50 mm×0.7 mm. The cut substrate was washed using ultrasonic waves in isopropyl alcohol, washed using ultrasonic waves in pure water for five minutes, washed using UV for 30 minutes, and then washed using ozone.

A m-TDATA hole injecting material was deposited on the anode to form a m-TDATA layer having a thickness of 60 nm such that the m-TDATA layer covered the green and blue subpixels. Then, a further m-TDATA layer having a thickness of 20 nm was formed over the green subpixel so that the hole injection layer over the green subpixel had a thickness of 80 nm, and the hole injection layer over the blue subpixel had a thickness of 60 nm. Then, NPB as a hole transporting material was deposited on the hole injection layer to form a hole transport layer having a thickness of 20 nm which covered the green and blue subpixels GGH01 (produced by Gracel Co.) as a green host and GGD01 (also produced by Gracel Co.) in a weight ratio of 97:3 as a green dopant were vacuum-deposited on the portion of the hole transport layer corresponding to the green subpixel to form a green emission layer having a thickness of 20 nm. Then, GBH 02 and GBD 32 (both produced by Gracel Co.) in a weight ratio of 97:3 were deposited on the green emission layer and the hole transport layer to form an electron transporting-blue emission layer having a thickness of 45 nm. That is, in the green subpixel, the electron transporting-blue emission layer was deposited on the green emission layer, and in the blue subpixel, the electron transporting-blue emission layer was deposited on the hole transport layer.

LiQ was deposited on the electron transporting-blue emission layer to form an electron injection layer having a thickness of 0.5 nm. Then, MgAg was deposited to a thickness of 150 nm to form a cathode. As a result, an OLED was prepared.

Comparative Example 1

An OLED was prepared as in Example 1, except that $Alq_3$ was deposited on the green emission layer and hole transport layer instead of GBH 02 and GBD 32.

Measurement Example 1

The efficiency and lifetime of the OLEDs prepared according to Example 1 and Comparative Example 1 were measured using a PR650 (Spectroscan) Source Measurement Unit and McScience Polaronix M6000. The results are shown in FIGS. 7 and 8.

Figure 7:
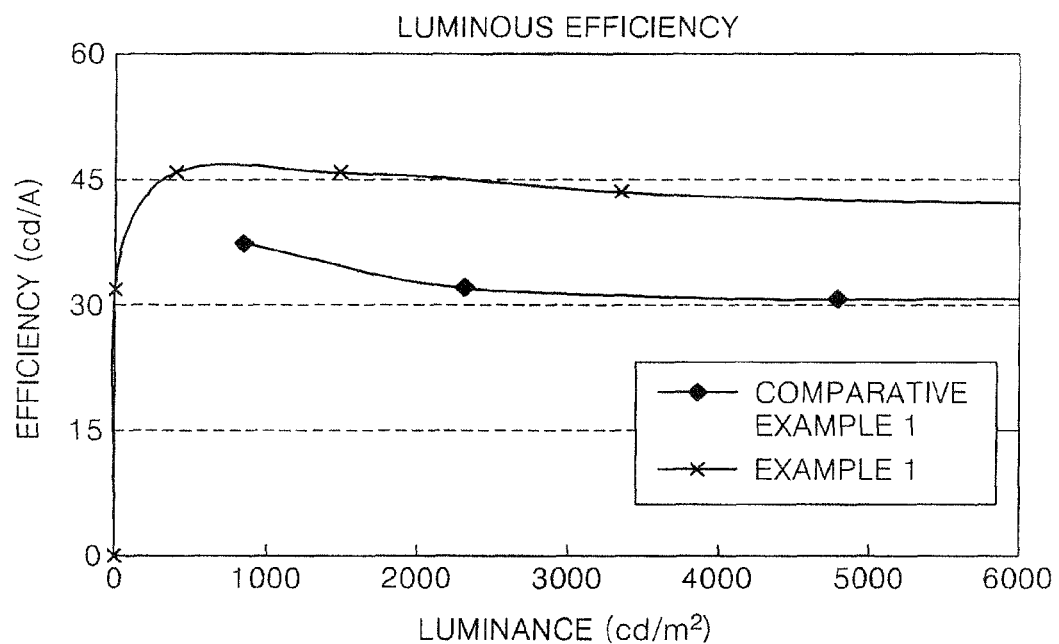
FIG. 7 is a graph comparing the luminance efficiency of the OLEDs prepared according to Example 1 and Comparative Example 1.

Referring to FIG. 7, the OLED prepared according to Example 1 showed higher efficiency than the OLED prepared according to Comparative Example 1.

Figure 8:
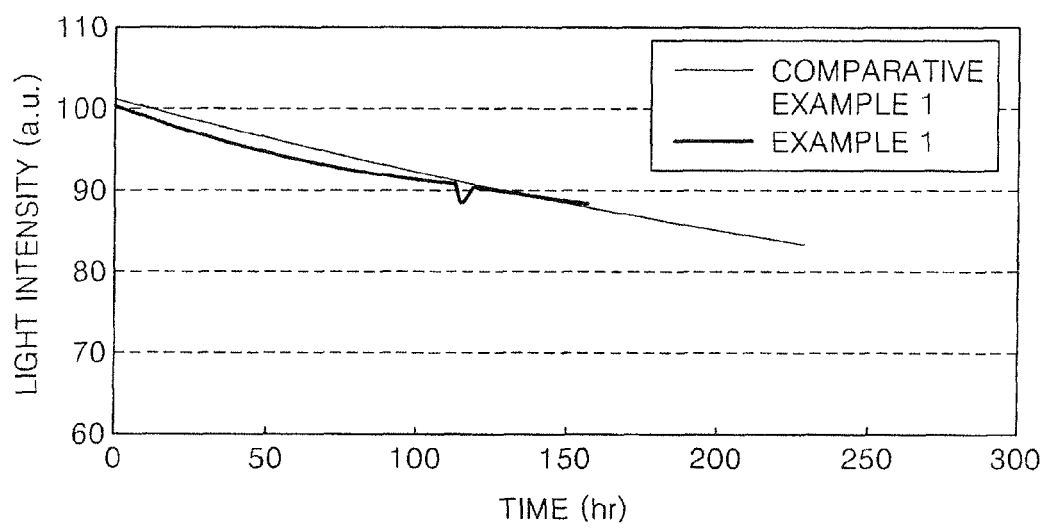
FIG. 8 is a graph comparing the lifetime characteristics of the OLEDs prepared according to Example 1 and Comparative Example 1.

Referring to FIG. 8, the OLED prepared according to Example 1 showed a longer lifetime than the OLED prepared according to Comparative Example 1.

Figure 9:
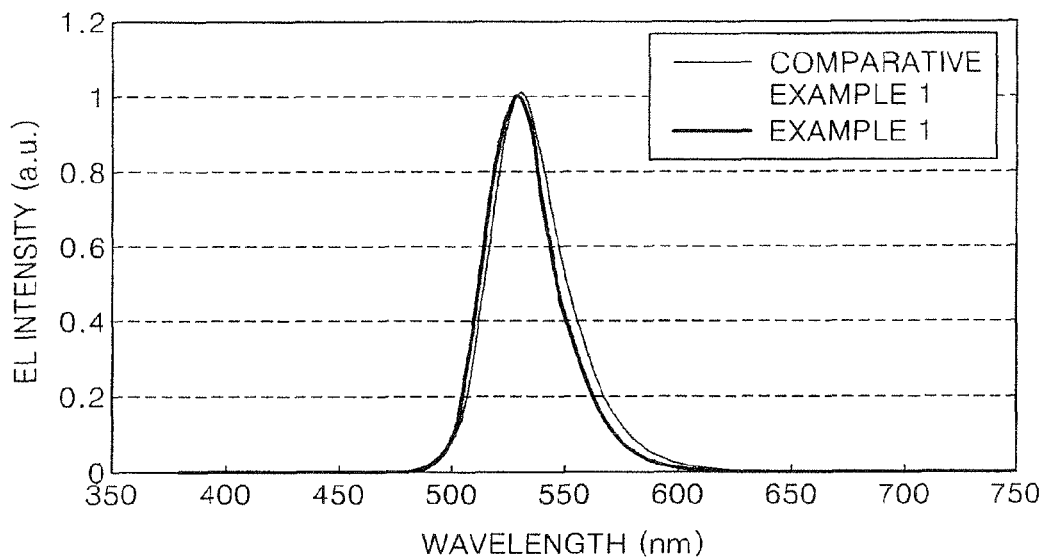
FIG. 9 is a graph comparing the UV spectra of the OLEDs prepared according to Example 1 and Comparative Example 1.

Electroluminescence (EL) spectra of the OLEDs prepared according to Example 1 and Comparative Example 1 were measured using a Spectra Radiometer (PR650, Photo Researcher Inc.). The results are shown in FIG. 9. Referring to FIG. 9, the OLEDs prepared according to Example 1 and Comparative Example 1 showed maximum emission at about 520 nm, which indicates green emission.

Example 2

A 100 nm-thick Ag and ITO substrate (produced by SDI Co., Ltd) was cut to a size of 50 mm×50 mm×0.7 mm. The cut substrate was washed using ultrasonic waves in isopropyl alcohol, washed using ultrasonic waves in pure water for five minutes, washed using UV for 30 minutes, and then washed using ozone.

A m-TDATA hole injecting material was deposited on the anode to form a m-TDATA layer having a thickness of 60 nm covering the red and blue subpixels. Then, a further m-TDATA layer having a thickness of 40 nm was formed over the red subpixel so that the hole injection layer over the red subpixel had a thickness of 100 nm, and the hole injection layer over the blue subpixel had a thickness of 60 nm. Then, NPB as a hole transporting material was deposited on the hole injection layer to form a hole transport layer having a thickness of 20 nm covering the red and blue subpixels GDI1403 (produced by Gracel Co.) as a red host and RD25 (produced by UDC) as a red dopant in a weight ratio of 90:10 were vacuum-deposited on the portion of the hole transport layer corresponding to the red subpixel to form a red emission layer having a thickness of 40 nm. Then, GBH 02 and GBD 32 (both produced by Gracel Co.) in a weight ratio of 97:3 were deposited on the red emission layer and the hole transport layer to form an electron transporting-blue emission layer having a thickness of 45 nm. That is, in the red subpixel, the electron transporting-blue emission layer was deposited on the red emission layer; and in the blue subpixel, the electron transporting-blue emission layer is deposited on the hole transport layer.

LiQ was deposited on the electron transporting-blue emission layer to form an electron injection layer having a thickness of 0.5 nm. Then, MgAg was deposited to a thickness of 150 nm to form a cathode. As a result, an OLED was prepared.

Comparative Example 2

An OLED was prepared as in Example 2, except that $Alq_3$ was deposited on the red emission layer and the hole transport layer instead of GBH 02 and GBD 32.

Measurement Example 2

The efficiency of the OLEDs prepared according to Example 2 and Comparative Example 2 were measured using a PR650 (Spectroscan) Source Measurement Unit and a McScience Polaronix M6000. The results are shown in FIG. 10.

Figure 10:
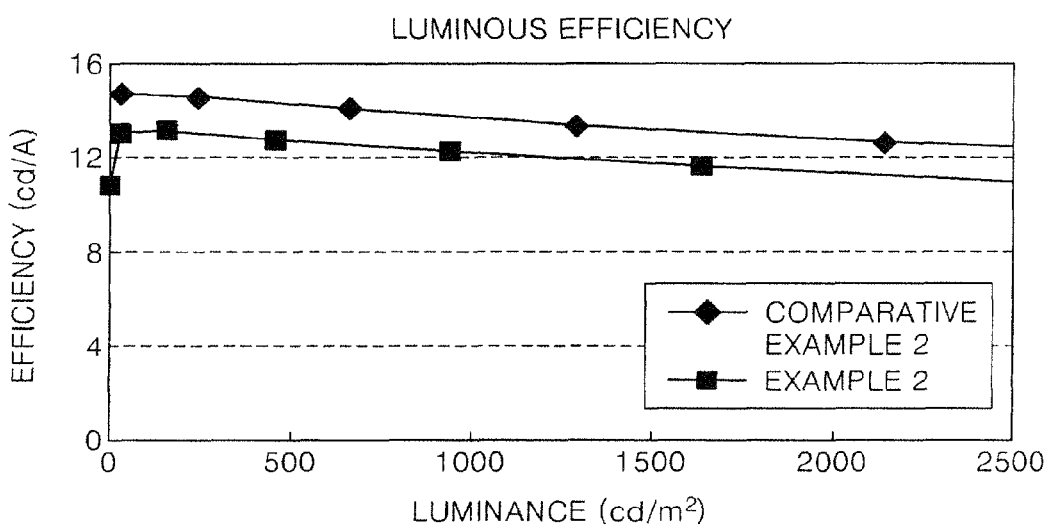
FIG. 10 is a graph comparing the luminance efficiency of the OLEDs prepared according to Example 2 and Comparative Example 2.

The efficiency results for the OLED prepared according to Example 2, shown in FIG. 10, depict the errors which can occur from the resonance structure. It is expected that if the color coordinates of the two OLEDs are tuned, the efficiency of the OLED prepared according to Example 2 will be higher than that of the OLED prepared according to Comparative Example 2.

Figure 11:
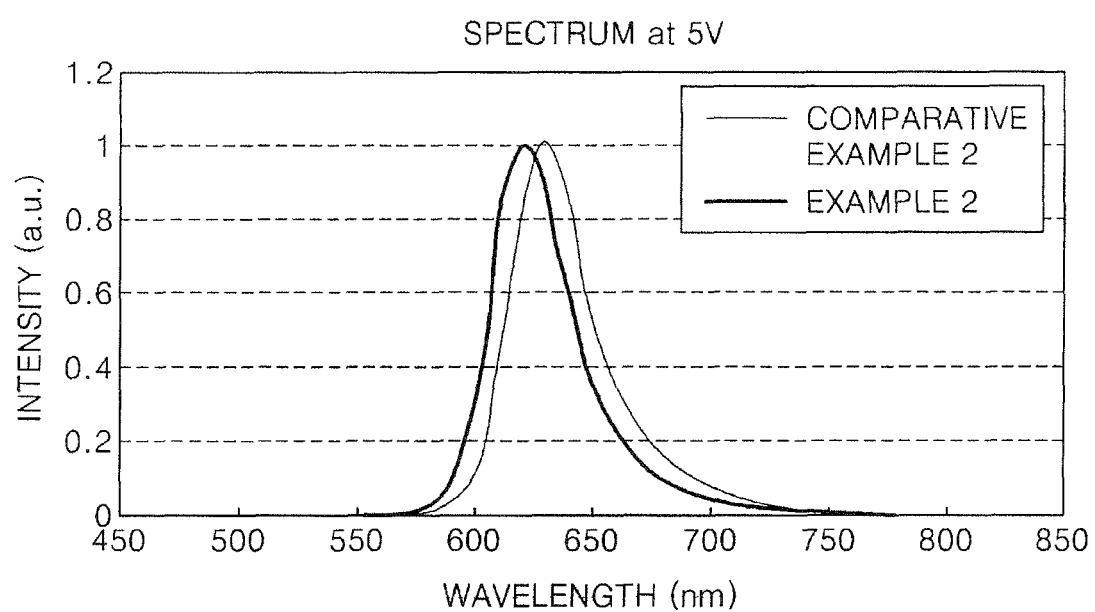
FIG. 11 is a graph comparing the UV spectra of the OLEDs prepared according to Example 2 and Comparative Example 2.

EL spectrums of the OLEDs prepared according to Example 2 and Comparative Example 2 were measured using a Spectra Radiometer (PR650, Photo Researcher Inc.). The results are shown in FIG. 11. Referring to FIG. 11, the OLEDs prepared according to Example 2 and Comparative Example 2 showed maximum emission at about 630 nm, which indicates red emission.

As described above, an OLED according to the present invention uses an electron transport layer to emit red, green, or blue light. A method of preparing the OLED is simple. Accordingly, the method of preparing the OLEDs according to the present invention are inexpensive and achieve high yield.

While the present invention has been illustrated and described with reference to certain exemplary embodiments, it will be understood by those of ordinary skill in the art that various modifications and changes to the described embodiments may be made without departing from the spirit and scope of the present invention as defined by the following claims.

What is claimed is:

1. An organic light emitting device comprising:
a substrate;
at least one first electrode;
a second electrode;
an organic layer between the first electrode and the second electrode, the organic layer comprising:
a first emission layer patterned to correspond only to a first subpixel and for emitting light selected from the group consisting of green light, red light and blue light;
a second emission layer patterned to correspond only to a second subpixel and for emitting light selected from the group consisting of green light, red light and blue light, wherein the second emission layer is for emitting light different from the light emitted by the first emission layer, and each of the first emission layer and the second emission layer consists of a single host material and a single light emitting dopant; and
a single electron transport-emission layer for transporting electrons and emitting light selected from the group consisting of red light and green light, wherein the electron transport-emission layer emits light different than the light emitted by both the first and second emission layers, wherein the electron transport-emission layer covers the first and second emission layers.

2. The organic light emitting device of claim 1, further comprising an electron injection layer contacting the single electron transport-emission layer, wherein the electron injection layer has a thickness from about 0.1 nm to about 10 nm.

3. An organic light emitting device comprising:
a substrate;
at least one first electrode;
a second electrode;
an organic layer between the first electrode and the second electrode, the organic layer comprising:
a first emission layer patterned to correspond only to a first subpixel and for emitting light selected from the group consisting of green light, red light and blue light;
a second emission layer patterned to correspond only to a second subpixel and for emitting light selected from the group consisting of green light, red light and blue light, wherein the second emission layer is for emitting light different from the light emitted by the first emission layer, and each of the first emission layer and the second emission layer consists of a single host material and a single light emitting dopant; and
a single electron transport-emission layer for transporting electrons and emitting light selected from the group consisting of red light and green light, wherein the electron transport-emission layer emits light different than the light emitted by both the first and second emission layers, and wherein the electron transport-emission layer covers the first and second emission layers; and
an electron injection layer contacting the single electron transport-emission layer, the electron injection layer comprising a material selected from the group consisting of LiQ, NaQ, CsQ, LiF, NaCI, CsF, $Li_2O$, and BaO.

4. An organic light emitting device comprising:
a substrate;
at least one first electrode;
a second electrode; and
an organic layer between the first electrode and the second electrode, the organic layer comprising:
a first emission layer patterned to correspond only to a first subpixel and for emitting light selected from the group consisting of green light, red light and blue light;
a second emission layer patterned to correspond only to a second subpixel and for emitting light selected from the group consisting of green light, red light and blue light, wherein the second emission layer is for emitting light different from the light emitted by the first emission layer;
a single electron transport-emission layer for transporting electrons and emitting light selected from the group consisting of red light and green light, wherein the electron transport-emission layer emits light different than the light emitted by both the first and second emission layers, and wherein the electron transport-emission layer covers the first and second emission layers; and
a hole injection layer between the emission layers and the first electrode, wherein a thickness of a portion of the hole injection layer covering a red subpixel is greater than a thickness of a portion covering a green subpixel, the thickness of the portion covering the green subpixel is greater than a thickness of a portion covering a blue subpixel.

5. The organic light emitting device of claim 4, wherein the first emission layer is for emitting green light, the second emission layer is for emitting blue light, and the electron transport-emission layer is a single electron transport-red emission layer for emitting red light.

6. The organic light emitting device of claim 5, wherein the electron transport-red emission layer comprises an organic metal complex represented by Formula 3:

$$[M(L)2]a \qquad \text{Formula 3}$$

wherein L is an anionic ligand, M is a metal capable of making a 5-coordinate bond or a 6-coordinate bond with L, and a is an integer ranging from 2 to 4.

7. The organic light emitting device of claim 6, wherein M is selected from the group consisting of Zn, Ni, Co, and Fe, and wherein L is selected from the group consisting of ligands represented by Formula 4a, 4b, 4c, or 4d:

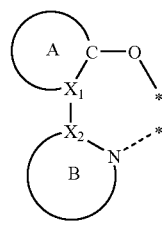

Formula 4a

-continued

Formula 4b

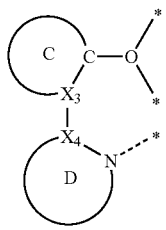

Formula 4c

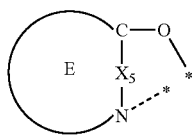

Formula 4d

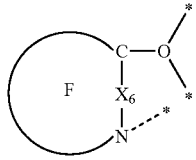

wherein:

A, B, C, D, E, and F are each independently selected from the group consisting of 5-20 member aromatic rings, and 5-20 member heteroaromatic rings, and wherein A and B are connected to each other and C and D are connected to each other;

X1, X2, X3, and X4 are each independently selected from the group consisting of C, N, O, S, and P;

X5 and X6 are each independently selected from the group consisting of C1-C10 alkylenes and C2-C10 alkenylenes; and

* is a binding site for M.

8. The organic light emitting device of claim 6, wherein L is selected from the group consisting of:

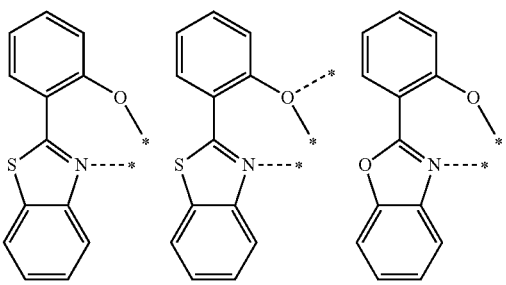

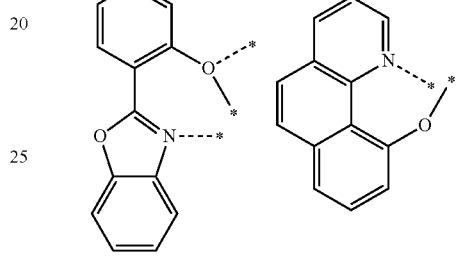

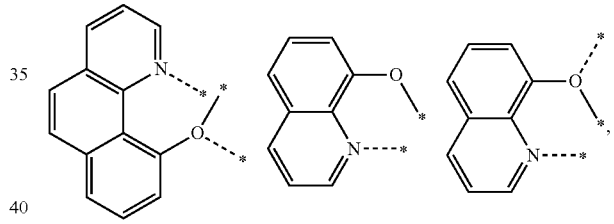

wherein * is a binding site for M.

9. The organic light emitting device of claim 6, wherein the organic metal complex is selected from the group consisting of compounds represented by Formula 6, 7, 8, and 9:

Formula 6

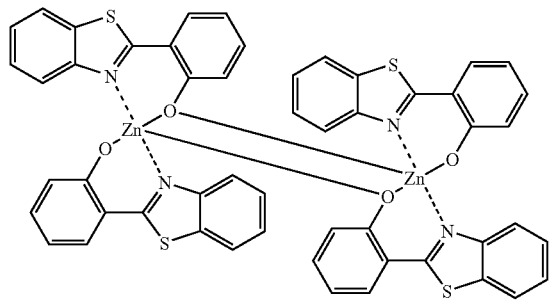

Formula 7

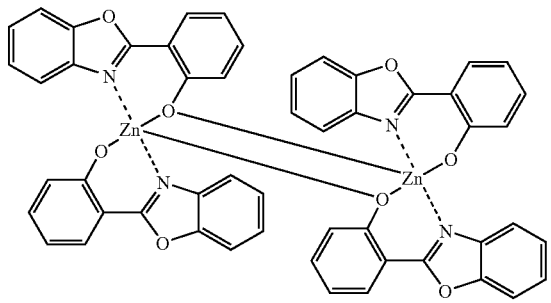

Formula 8

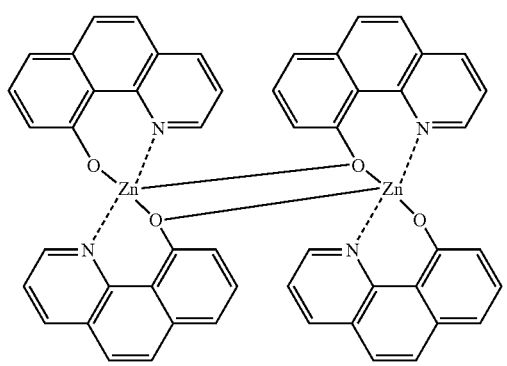

Formula 9

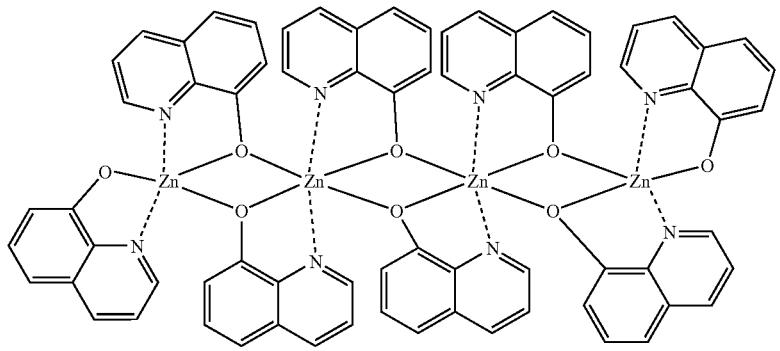

10. The organic light emitting device of claim 5, wherein the electron transport-red emission layer further comprises an organic metal complex phosphorescent dopant comprising a metal selected from the group consisting of Ir, Pt, Os, Re, Ti, Zr, and Hf.

11. The organic light emitting device of claim 10, wherein the phosphorescent dopant is selected from the group consisting of bisthienylpyridine acetylacetonate Iridium, bis(benzothienylpyridine)acetylacetonate Iridium, bis(2-phenylbenzothiazole)acetylacetonate Iridium, bis(1-phenylisoquinoline) acetylacetonate Iridium, tris(1-phenylisoquinoline) Iridium, tris(phenylpyridine) Iridium, tris(2-biphenylpyridine) Iridium, tris(3-biphenyl pyridine) Iridium, tris(4-biphenyl pyridine) Iridium, Ir(pq)2(acac) represented by Formula 10, Ir(piq)3 represented by Formula 11, Ir(piq)2 represented by Formula 12, compounds represented by Formula 13, compounds represented by Formula 14, compounds represented by Formula 15, and compounds represented by Formula 16:

Formula 10

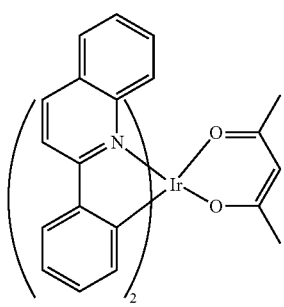

Formula 11

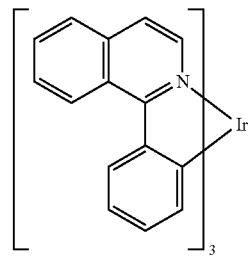

Formula 12

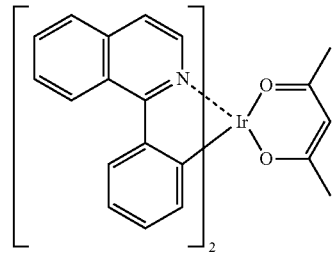

Formula 13

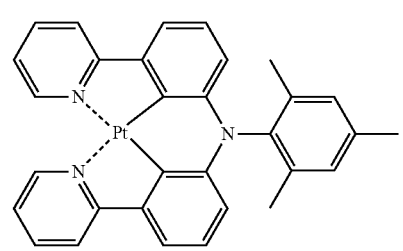

Formula 14

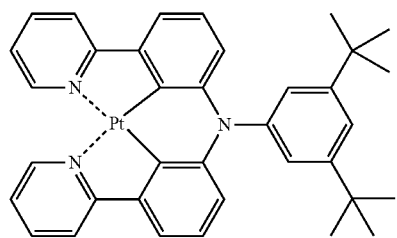

Formula 15

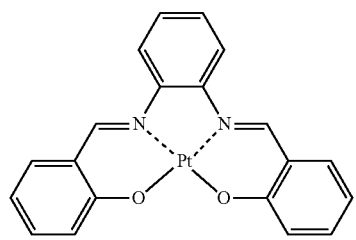

Formula 16

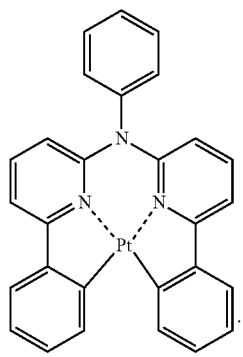

12. The organic light emitting device of claim 5, wherein the electron transport-red emission layer further comprises a host selected from the group consisting of CBP, Alq3, BAlq, and Bebq.

13. The organic light emitting device of claim 4, wherein the first emission layer is for emitting red light, the second emission layer is for emitting blue light, and the electron transport-emission layer is a single electron transport-green emission layer for emitting green light.

14. The organic light emitting device of claim 13, wherein the electron transport-green emission layer comprises a green host represented by Formula 1 and a green dopant represented by Formula 2:

Formula 1

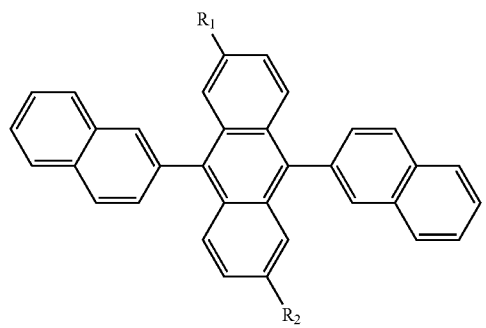

Formula 2

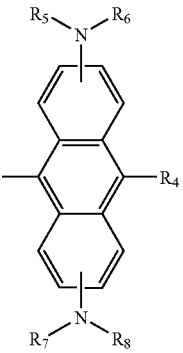

wherein R1 and R2 are each independently selected from the group consisting of hydrogen and C6-C30 aryl group, and R3, R4, R5, R6, R7, and R8 are each independently selected from the group consisting of hydrogen, C1-C20 alkyl groups, C1-C20 alkoxy groups, and C6-C30 aryl groups.

15. The organic light emitting device of claim 14, wherein the green host is selected from the group consisting of Compounds 1, 2, and 3:

Compound 1

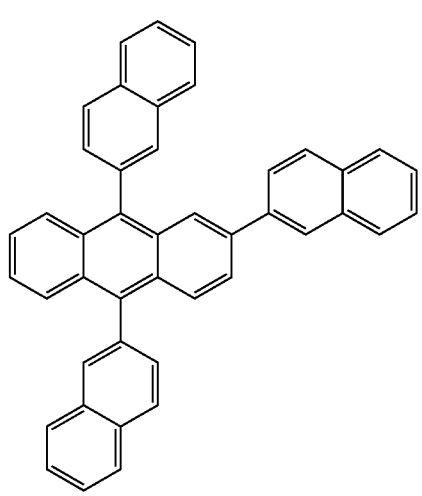

Compound 2

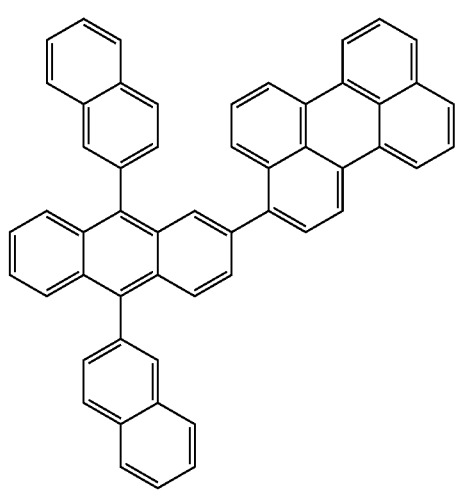

Compound 3

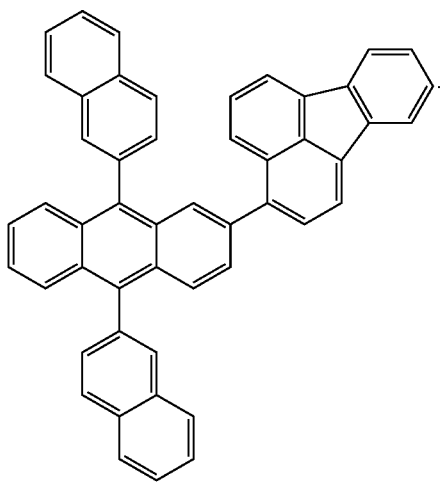

Compound 4

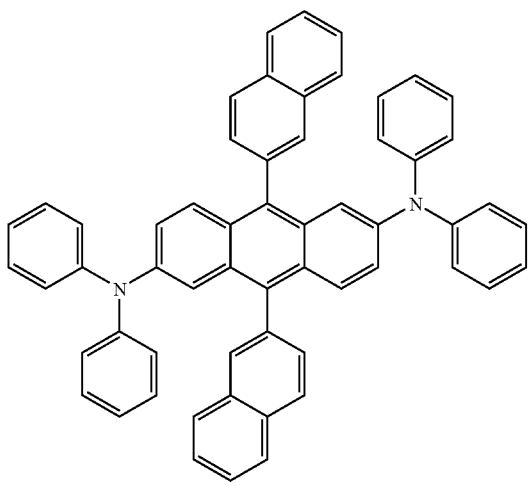

Compound 5

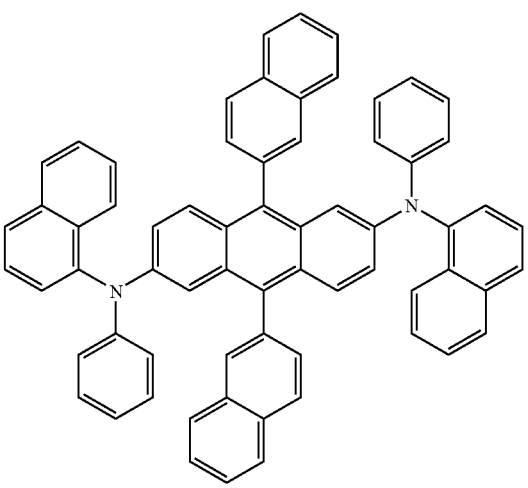

Compound 6

16. The organic light emitting device of claim 14, wherein the green dopant is selected from the group consisting of Compounds 4, 5, and 6:

17. The organic light emitting device of claim 4, wherein the organic layer further comprises a layer selected from the group consisting of hole injection layers, hole transport layers, hole blocking layers, electron injection layers, and combinations thereof.

* * * * *